United States Patent
Lee et al.

(10) Patent No.: US 11,315,957 B2
(45) Date of Patent: Apr. 26, 2022

(54) LIGHT EMITTING DISPLAY APPARATUS

(71) Applicant: LG Display Co., Ltd., Seoul (KR)

(72) Inventors: Sul Lee, Paju-si (KR); Dongwook Choi, Paju-si (KR); Minki Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 248 days.

(21) Appl. No.: 16/521,957

(22) Filed: Jul. 25, 2019

(65) Prior Publication Data

US 2020/0043949 A1    Feb. 6, 2020

(30) Foreign Application Priority Data

Jul. 31, 2018   (KR) .................. 10-2018-0089489

(51) Int. Cl.
*H01L 27/12*   (2006.01)
*H01L 27/15*   (2006.01)
*H01L 27/32*   (2006.01)

(52) U.S. Cl.
CPC ........ *H01L 27/124* (2013.01); *H01L 27/1255* (2013.01); *H01L 27/156* (2013.01)

(58) Field of Classification Search
CPC . H01L 27/124; H01L 27/1255; H01L 27/156; H01L 27/3276; H01L 29/78696; H01L 27/1222; H01L 27/283; H01L 33/62; G09F 9/33; G09G 3/32; G09G 3/30; G09G 2330/028
See application file for complete search history.

(56) References Cited

U.S. PATENT DOCUMENTS

| | | |
|---|---|---|
| 9,412,800 B2 | 8/2016 | Kim |
| 9,837,021 B2 | 12/2017 | Lee et al. |
| 2011/0221661 A1 | 9/2011 | Yoon et al. |
| 2013/0285537 A1 | 10/2013 | Chaji |

(Continued)

FOREIGN PATENT DOCUMENTS

| | | |
|---|---|---|
| CN | 102194853 A | 9/2011 |
| CN | 102496601 A | 6/2012 |

(Continued)

OTHER PUBLICATIONS

First Notification of Office Action dated Apr. 27, 2021, issued in corresponding Chinese Patent Application No. 201910700593.5.

(Continued)

*Primary Examiner* — Benjamin Tzu-Hung Liu
(74) *Attorney, Agent, or Firm* — Morgan, Lewis & Bockius LLP

(57) ABSTRACT

A light emitting display apparatus is disclosed. The light emitting display apparatus includes: a substrate; and a plurality of pixels disposed on a pixel area on the substrate. Each of the plurality of pixels includes: a first circuit layer including a first pixel circuit including a driving transistor; a second circuit layer overlapping the first circuit layer, wherein the second circuit layer includes a second pixel circuit including a data supply transistor configured to supply a data signal to the first pixel circuit; a circuit insulating layer between the first circuit layer and the second circuit layer; and a light emitting diode layer including a light emitting diode electrically connected with the first pixel circuit.

14 Claims, 9 Drawing Sheets

(56) References Cited

U.S. PATENT DOCUMENTS

2015/0130691 A1    5/2015  Jeon
2018/0026218 A1*   1/2018  Kobayashi ........... G09G 3/2003
                                                           349/143

FOREIGN PATENT DOCUMENTS

| CN | 104254915 A    | 12/2014 |
|----|----------------|---------|
| CN | 104637437 A    | 5/2015  |
| CN | 104637972 A    | 5/2015  |
| CN | 106206430 A    | 12/2016 |
| CN | 106298852 A    | 1/2017  |
| CN | 107579056 A    | 1/2018  |
| CN | 107845648 A    | 3/2018  |
| KR | 20080061766 A  | 7/2008  |
| KR | 10-2015-0043143 A | 4/2015 |
| KR | 10-2016-0007745 A | 1/2016 |

OTHER PUBLICATIONS

Second Notification of Office Action dated Mar. 3, 2022, issued in corresponding Chinese Patent Application No. 201910700593.5.

* cited by examiner

US 11,315,957 B2

LIGHT EMITTING DISPLAY APPARATUS

This application claims priority from and the benefit of Korean Patent Application No. 10-2018-0089489 filed on Jul. 31, 2018, which is hereby incorporated by reference in its entirety for all purposes as if fully set forth herein.

BACKGROUND

Technical Field

The present disclosure relates to a light emitting display apparatus.

Description of the Related Art

A light emitting display apparatus displays an image by using a self-light emitting diode. As such, the light emitting display apparatus has high response speed, low power consumption, and has few problems with viewing angles. Light emitting display apparatuses have been spotlighted as next generation display apparatuses. A general light emitting display apparatus includes a pixel circuit formed for each pixel. The pixel circuit emits light from a light emitting diode by controlling a size of a current flowing to and from a driving power source to the light emitting diode, using switching of a driving thin film transistor according to a data voltage. The pixel circuit thereby displays a predetermined image.

In a light emitting display apparatus, a current flowing to a light emitting diode of each pixel may be varied by a threshold voltage deviation of a driving transistor due to causes such as a process deviation. Therefore, the pixel circuit of the general light emitting display apparatus may not implement uniform picture quality as a data current output from the driving transistor. The data current may vary per pixel including when the data voltage is the same.

A recent trend is to implement a light emitting display apparatus in a mobile electronic device, a virtual image display apparatus, or a head mounted display apparatus. The resolution of such display apparatuses have gradually increased. As resolution of the light emitting display apparatus gradually increases, a pixel size gradually decreases, and it may become difficult to form or arrange a pixel circuit including an internal compensation circuit in the pixel. For this reason, it may be difficult to implement the light emitting display apparatus with high resolution.

SUMMARY

Accordingly, the present disclosure is directed to a light emitting display apparatus that substantially obviates one or more of the problems due to limitations and disadvantages of the related art.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other aspects of the inventive concepts, as embodied and broadly described, there is provided a light emitting display apparatus. In some example embodiments, the light emitting display apparatus comprises: a substrate; and a plurality of pixels disposed on a pixel area on the substrate, wherein each of the plurality of pixels includes: a first circuit layer including a first pixel circuit including a driving transistor; a second circuit layer overlapping the first circuit layer, wherein the second circuit layer includes a second pixel circuit including a data supply transistor configured to supply a data signal to the first pixel circuit; a circuit insulating layer between the first circuit layer and the second circuit layer; and a light emitting diode layer including a light emitting diode electrically connected with the first pixel circuit.

In some example embodiments, the first circuit layer is between the substrate and the circuit insulating layer. In some example embodiments, the second circuit layer further includes a plurality of circuit connectors configured to electrically connect the second pixel circuit with the first pixel circuit through the circuit insulating layer. In some example embodiments, the first pixel circuit is configured to supply a data current corresponding to a gate-source voltage of the driving transistor to the light emitting diode based on the data signal supplied from the second pixel circuit. In some example embodiments, the driving transistor includes first source-drain electrodes connected to a first node, second source-drain electrodes connected to a second node, and a gate electrode connected to a third node.

In some example embodiments, the first pixel circuit includes: a first light emitting control transistor configured to turn on based on a light emitting control signal, wherein the light emitting control signal is configured to supply a pixel driving voltage to the first node; a second light emitting control transistor configured to turn on based on the light emitting control signal, thereby forming a current path between the second node and a fourth node; and a storage capacitor including a first capacitor electrode corresponding to a gate electrode of the driving transistor, and a second capacitor electrode that overlaps the first capacitor electrode, wherein the second capacitor electrode is configured to be supplied with the pixel driving voltage, wherein the light emitting diode is electrically connected with the fourth node.

In some example embodiments, the first circuit layer includes: a light emitting control line configured to supply the light emitting control signal to the first pixel circuit; a pixel driving power line configured to supply the pixel driving voltage to the first pixel circuit; a first line contact hole electrically connecting the pixel power driving line with first source-drain electrodes of the first light emitting control transistor; and a second line contact hole electrically connecting the pixel power driving line with the second capacitor electrode.

In some example embodiments, the second pixel circuit further includes: the data supply transistor configured to turn on based on a scan control signal, thereby supplying the data signal to the first node; a sampling transistor configured to turn on based on the scan control signal, thereby electrically connecting the second node with the third node; a first initialization transistor configured to turn on based on an initialization control signal, thereby supplying an initialization voltage to the third node; and a second initialization transistor configured to turn on based on the initialization control signal, thereby supplying the initialization voltage to the fourth node.

In some example embodiments, the sampling transistor includes first and second sampling transistors connected in series between the second node and the third node. In some example embodiments, the second circuit layer further includes: a data line configured to supply the data signal to the second pixel circuit; a scan control line configured to supply the scan control signal to the second pixel circuit; an initialization control line configured to supply the initialization control signal to the second pixel circuit; an initialization voltage line configured to supply the initialization voltage to the second pixel circuit; a third line contact hole electrically connecting the data line with first source-drain electrodes of the data supply transistor; and a fourth line contact hole electrically connecting the initialization voltage line with first source-drain electrodes of each of the first initialization transistor and the second initialization transistor.

In some example embodiments, the first circuit layer further includes: a first node connection pattern electrically connected with the first node; a second node connection pattern electrically connected with the second node; a third node connection pattern electrically connected with the gate electrode of the driving transistor; and a fourth node connection pattern electrically connected with the fourth node, wherein each of the first to fourth node connection patterns is electrically connected with the second pixel circuit.

In some example embodiments, the second circuit layer further includes: first, second, third, and fourth circuit connectors respectively electrically connected with each of the first to fourth node connection patterns; the data supply transistor configured to turn on based on a scan control signal supplied to a scan control line, thereby supplying the data signal supplied from a data line to the first circuit connector; a sampling transistor configured to turn on based on the scan control signal, thereby electrically connecting the second circuit connector with the third circuit connector; a first initialization transistor configured to turn on based on an initialization control signal supplied to an initialization control line, thereby supplying an initialization voltage supplied from an initialization voltage line to the third circuit connector; and a second initialization transistor configured to turn on based on the initialization control signal, thereby supplying the initialization voltage to the fourth circuit connector.

In some example embodiments, the initialization control line and the scan control line are parallel to each other, and the first to fourth circuit connectors are between the initialization control line and the scan control line. In some example embodiments, the light emitting display apparatus further comprises: a planarization layer covering the second circuit layer; and an encapsulation layer covering the light emitting diode layer, wherein the light emitting diode includes: a pixel driving electrode electrically connected with the first pixel circuit; a light emitting layer on the pixel driving electrode; and a cathode electrode layer electrically connected with the light emitting layer.

In the display apparatus according to the present disclosure, as a pixel circuit of a pixel may be deposited in a two-layered structure, even though a size of the pixel is reduced due to high resolution, the pixel circuit may sufficiently be arranged in the pixel, whereby high resolution may be implemented.

It is to be understood that both the foregoing general description and the following detailed description are exemplary and explanatory, and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this application, illustrate example embodiments of the present disclosure and together with the description serve to explain the principles of the present disclosure. In the drawings.

DETAILED DESCRIPTION

Figure 1:
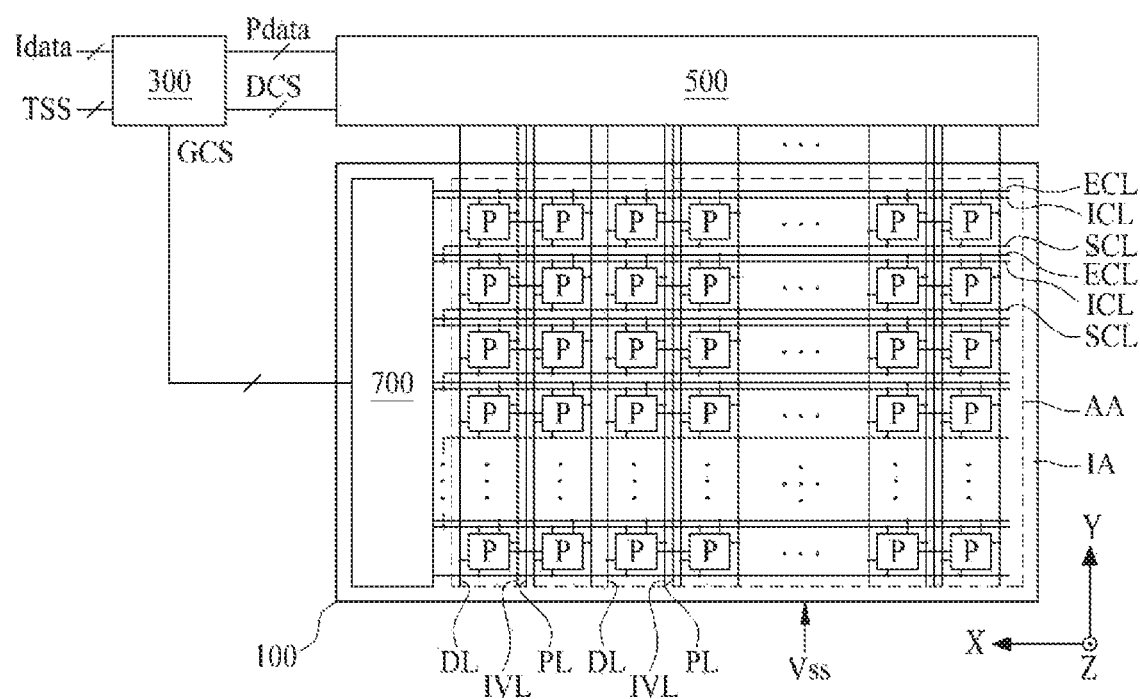
FIG. 1 illustrates a light emitting display apparatus according to one example embodiment.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art. Further, the present disclosure is defined by the scope of the claims.

Reference will now be made in detail to embodiments of the present disclosure, examples of which may be illustrated in the accompanying drawings. In the following description, a detailed description of functions or configurations related to this document that are well-known to those skilled in the art may be omitted. The progression of processing steps and/or operations described is an example. The sequence of steps and/or operations is not limited to that set forth herein and may be changed as is known in the art or apparent to those skilled in the art, with the exception of steps and/or operations necessarily occurring in a particular order. Names of the respective elements used in the following explanations are selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case which is not continuous may be included unless a more limiting term, such as "just," "immediate(ly)," or "direct(ly)," is used. It will be understood that, although the terms like "first," "second," etc., may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified. The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified. Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship. Reference will now be made in detail to example embodiments of the disclosure, which are illustrated in the accompanying drawings. Wherever possible, the same reference numbers will be used throughout the drawings to refer to the same or like parts.

FIG. 1 illustrates a light emitting display apparatus according to one example embodiment. As illustrated in FIG. 1, the light emitting display apparatus includes a light emitting display panel 100, a timing controller 300, a data driving circuit 500, and a gate driving circuit 700. The light emitting display panel 100 includes a substrate, a display area AA defined on the substrate, and a non-display area IA surrounding the display area AA. The substrate may be a base substrate (or base layer), and may include a plastic material or a glass material. The substrate according to one example embodiment may have a two-dimensional rectangular shape, a rectangular shape of which corners are rounded with a certain curvature radius, or a non-rectangular shape having at least six sides. The substrate having a non-rectangular shape may include at least one protrusion and/or at least one notch portion.

The substrate according to one example embodiment may include an opaque or colored polyimide material. For example, the substrate of the polyimide material may be the substrate obtained by hardening a polyimide resin coated on a front surface of a release layer provided in a relatively thick carrier substrate at a certain thickness. The carrier glass substrate may be detached from the substrate by release of the release layer using a laser release process. The substrate according to one example embodiment may further include a back plate coupled to a rear surface of the substrate based on a thickness direction Z. The back plate may maintain the substrate at a plane state. The back plate according to one example embodiment may include a plastic material, for example, polyethylene terephthalate material. The back plate may be laminated on the rear surface of the substrate detached from the carrier glass substrate.

The substrate according to another example embodiment may be a flexible glass substrate. For example, the substrate of the glass material may be a thin glass substrate having a thickness of 100 micrometers or less. Alternatively, the substrate of the glass may be a carrier glass substrate etched to have a thickness of 100 micrometers or less by a substrate etching process performed after completing a manufacturing process of the light emitting display panel 100. The display area AA may include a plurality of initialization control lines ICL, a plurality of scan control lines SCL, a plurality of light emitting control lines ECL, a plurality of data lines DL, a plurality of pixel driving power lines PL, a plurality of initialization power lines IVL, a common electrode layer, and a plurality of pixels P.

Each of the plurality of initialization control lines ICL may extend longitudinally along a first direction X, and the respective initialization control lines ICL may be spaced apart from each other along a second direction Y crossing the first direction X. The first direction X may be parallel with a horizontal direction of the substrate, and the second direction Y may be parallel with a vertical direction of the substrate. Each of the plurality of initialization control lines ICL may supply an initialization control signal supplied from the gate driving circuit 700 to the pixels P.

Each of the plurality of scan control lines SCL extends longitudinally along the first direction X, and adjoins each of the initialization control lines ICL. One end of each of the plurality of scan control lines SCL may be electrically connected with one side of its adjacent initialization control line ICL. For example, the display area AA may include first to m+1th initialization control lines ICL and first to mth scan control lines SCL. One end of the ith scan control line SCL (i is a natural number) may be electrically connected with one side of the i+1th initialization control line ICL. Each of the plurality of scan control lines SCL supplies a scan control signal supplied from the gate driving circuit 700 to the pixels P.

Each of the plurality of light emitting control lines ECL extends longitudinally along the first direction X, and is in parallel with each of the initialization control lines ICL. Each of the plurality of light emitting control lines ECL may supply a light emitting control signal supplied from the gate driving circuit 700 to the pixels P. Each of the plurality of data lines DL may extend longitudinally along the second direction Y, and the respective data lines DL may be spaced apart from each other along the first direction X. Each of the plurality of data lines DL may supply a data signal (or pixel data voltage) supplied from the data driving circuit 500 to the pixels P.

Each of the plurality of pixel driving power lines PL may be in parallel with each of the data lines DL. Each of the plurality of pixel driving power lines PL may supply a pixel driving voltage supplied from a power supply circuit to the pixels P. Each of the plurality of pixel driving power lines PL according to one example embodiment may be arranged per two pixels adjacent to each other along the first direction X. That is, one pixel driving power line PL may be shared by two pixels adjacent to each other along the first direction X. Each of the plurality of initialization power lines IVL may be in parallel with each of the data lines DL. Each of the plurality of initialization power lines IVL may supply an initialization voltage supplied from the data driving circuit 500 or the power supply circuit to the pixels P.

The common electrode layer may be on the entire display area AA. The common electrode layer may supply a common power source Vss supplied from the data driving circuit 500 or the power supply circuit to the pixels. The display area AA may include at least one common power supply line electrically connected with the common electrode layer. Each of the plurality of pixels P is in a pixel area defined on the display area AA of the substrate. Each of the plurality of pixels P may be electrically connected with the initialization control line ICL, the scan control line SCL, the light emitting control line ECL, the data line DL, the pixel driving power line PL, the initialization power line IVL, and the common electrode layer, any of which may pass through the pixel area or may be near the pixel area. To implement high resolution of the light emitting display panel 100 according to the present disclosure, each of the initialization control line ICL, the scan control line SCL and the light emitting control line ECL may pass through the pixel area. Also, each of the data line DL, the pixel driving power line PL and the initialization power line IVL may be outside the pixel area. Two pixels adjacent to each other along the first direction X may have a symmetrical structure based on the pixel driving power line PL.

The pixels P according to one example embodiment may be on the display area AA to have a stripe structure. One unit pixel may include a red pixel, a green pixel, and a blue pixel. Moreover, one unit pixel may further include a white pixel. The pixels P according to another example embodiment may be on the display area AA to have a pentile structure. One unit pixel may include at least one red pixel, at least two green pixels, and at least one blue pixel, any of which may be in a two-dimensional polygonal shape. For example, one unit pixel having a pentile structure may be arranged such that one red pixel, two green pixels, and one blue pixel have a two-dimensional octagonal shape. The blue pixel may have an opening area (or light emitting area) which is relatively the greatest, and the green pixel may have an opening area which is relatively the smallest.

Each of the plurality of pixels P may be operated in the order of an initialization period, a sampling period and a light emitting period to emit light of luminance corresponding to the data signal supplied to the data line DL. The non-display area IA may be provided along an edge of the substrate to surround the display area AA. One side of the non-display area IA may include a pad portion. The pad portion may be on one side of the non-display area, and may be electrically connected with lines on the display area AA along the second direction Y. The pad portion may be electrically connected to the data driving circuit 500.

The timing controller 300 generates pixel data Pdata by aligning input image data Idata to be suitable for driving the light emitting display panel 100 and generates a data control signal DCS based on a timing synchronization signal TSS to provide the generated data and signal to the data driving circuit 500. The timing controller 300 generates a gate control signal GCS including a plurality of gate shift clocks and a gate start signal based on the timing synchronization signal TSS and provided the generated signals to the gate driving circuit 700. The gate control signal GCS may be supplied to the gate driving circuit 700 by passing through the pad portion. The data driving circuit 500 is connected with the plurality of data lines DL provided on the light emitting display panel 100 by passing through the pad portion. The data driving circuit 500 converts the pixel data Pdata provided from the timing controller 300 to analog type data signals by using the data control signal DCS and a plurality of reference gamma voltages, and supplies the converted data signals to the corresponding data line DL.

The gate driving circuit 700 may generate an initialization control signal, a scan control signal and a light emitting control signal. These signals may respectively correspond to the initialization period, the sampling period and the light emitting period of each of the plurality of pixels P, based on the gate control signal DCS provided from the timing controller 300, and may supply the generated signals to the plurality of pixels P. The gate driving circuit 700 according to one example embodiment generates initialization control signals of which phases are sequentially shifted with the same period and sequentially supplies the generated signals to the plurality of initialization control lines ICL. The gate driving circuit 700 also generates light emitting control signals of which phases are sequentially shifted with the same period and supplies the generated signals to the plurality of light emitting control lines ECL.

The initialization control signal is supplied to each of the other initialization control lines, except that the first one of the plurality of initialization control lines ICL is used as the scan control signal supplied to each of the plurality of scan control lines SCL. For example, the scan control signal supplied to the first scan control line may be used as the initialization control signal supplied to the second initialization control line. The initialization control signal may be expressed as a previous (or i-1th) scan control signal, and the scan control signal may be expressed as a current (or ith) scan control signal. Therefore, because the gate driving circuit 700 does not need a separate circuit for supplying the scan control signal to each of the plurality of scan control lines SCL, the circuit configuration may be simplified.

The gate driving circuit 700 according to one example embodiment may be formed on the non-display area at a left side and/or a right side of the substrate together with a manufacturing process of a thin film transistor of the pixel P. As an example, the gate driving circuit 700 may be formed on the non-display area at the left side of the substrate, and may supply the initialization control signal and the light emitting control signal to one end of each of the initialization control line ICL and the light emitting control line ECL in accordance with a single feeding method. As another example, the gate driving circuit 700 may be formed on the non-display area at each of the left side and the right side of the substrate. In this example, the gate driving circuit 700 may supply the initialization control signal and the light emitting control signal to both ends of each of the initialization control line ICL and the light emitting control line ECL in accordance with a double feeding method.

Figure 2:
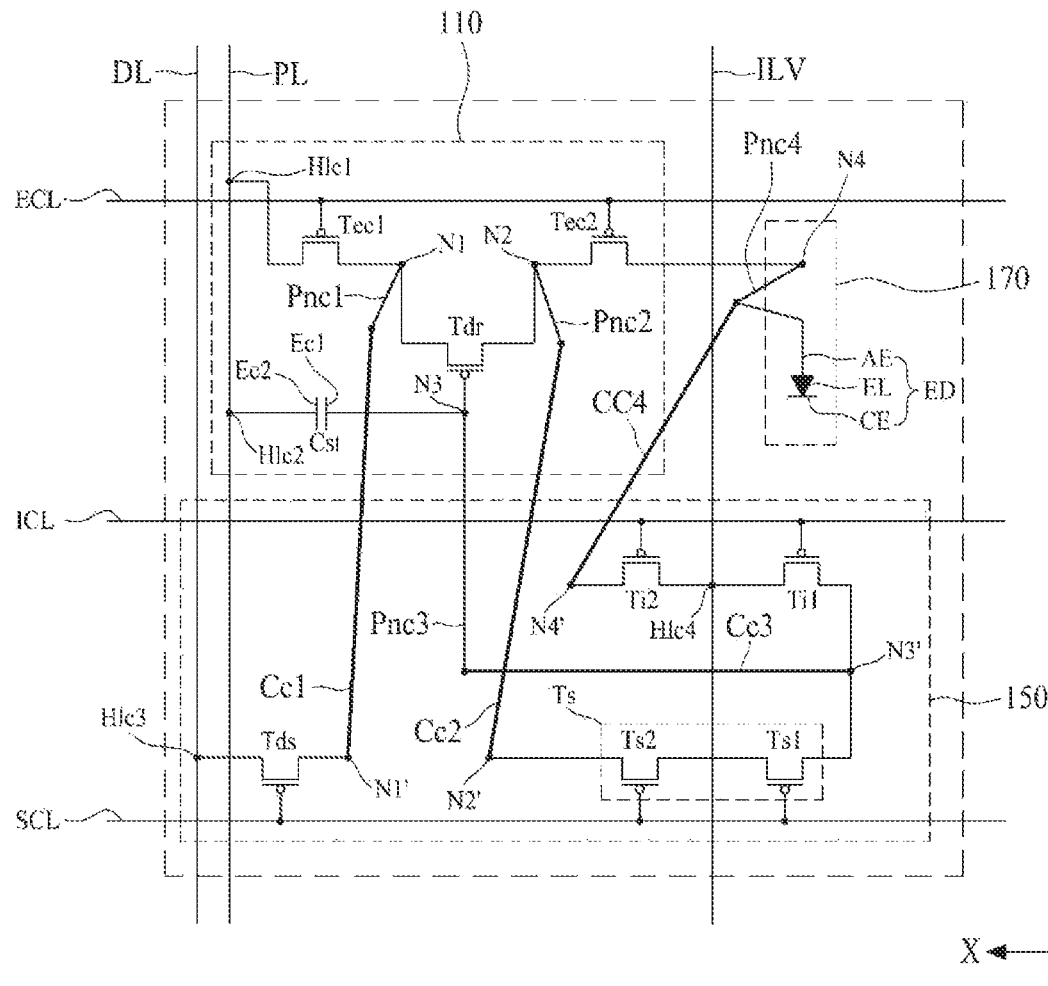
FIG. 2 illustrates a pixel according to one example embodiment.
Figure 3:
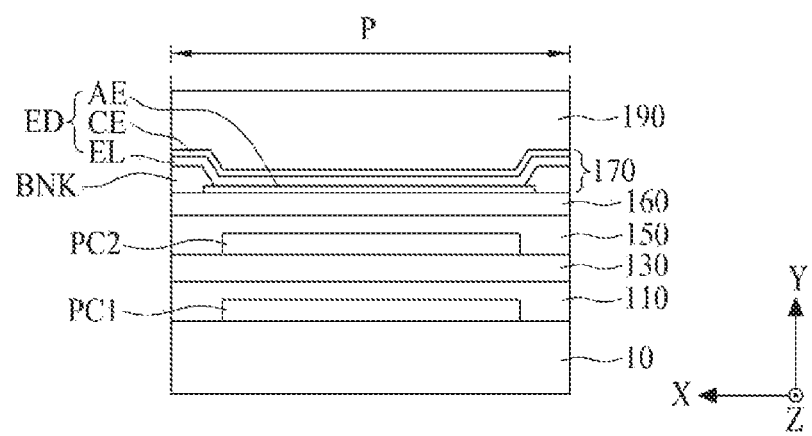
FIG. 3 is a cross-sectional view that illustrates a layer structure of a pixel shown in FIG. 2.
Figure 4:
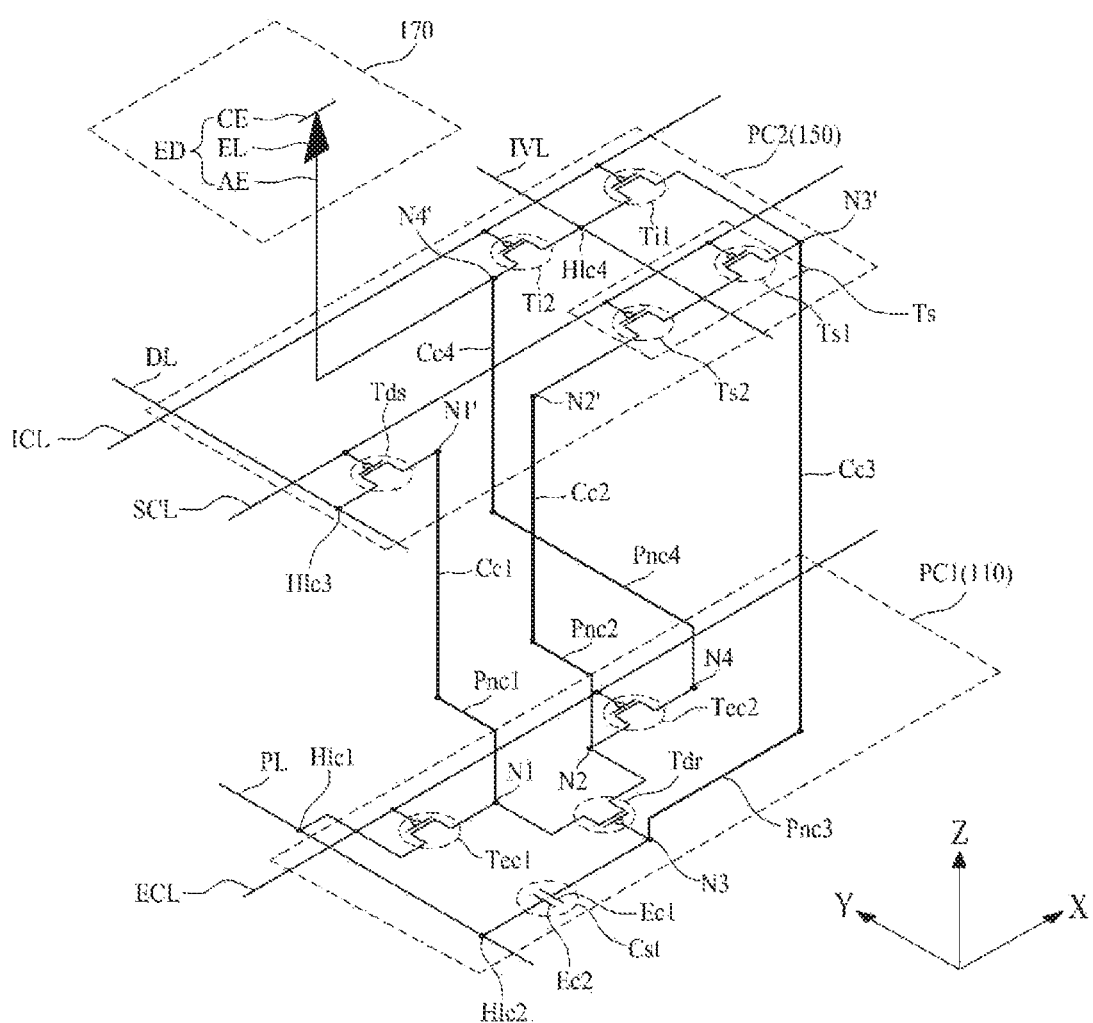
FIG. 4 illustrates a circuit configuration per layer shown in FIG. 3.

FIG. 2 illustrates a pixel according to one example embodiment. FIG. 3 is a cross-sectional view that illustrates a layer structure of a pixel shown in FIG. 2. FIG. 4 illustrates a circuit configuration per layer shown in FIG. 3. As illustrated in FIGS. 2 to 4, the pixel P according to one example embodiment may include a first circuit layer 110 having a first pixel circuit PC1 including a driving transistor Tdr, and a second circuit layer 150 having a second pixel circuit PC2 overlapping the first circuit layer 110 and including a data supply driving transistor Tds for supplying a data signal to the first pixel circuit PC1. The pixel P may further include a circuit insulating layer 130 between the first circuit layer 110 and the second circuit layer 150, and a light emitting diode layer 170 having a light emitting diode ED electrically connected with the first pixel circuit PC1. The first circuit layer 110 may be on an upper surface (or surface) of the substrate 10. That is, the first circuit layer 110 may be between the substrate 10 and the circuit insulating layer 130.

The first circuit layer 110 according to one example embodiment may include a first pixel circuit PC1, a light emitting control line ECL for supplying a light emitting control signal to the first pixel circuit PC1, and a pixel driving power line PL for supplying a pixel driving voltage to the first pixel circuit PC1. The light emitting control line ECL is on a first area of the pixel P to be parallel with the first direction X. The first area of the pixel P may be defined as an upper area of the pixel based on the second direction Y. The pixel driving power line PL is at one side corner of the pixel P to be parallel with the second direction Y. One side corner of the pixel P may be defined as a left corner area of the pixel based on the first direction X.

The first pixel circuit PC1 supplies a data current corresponding to a gate-source voltage of the driving transistor Tdr based on the data signal supplied from the second pixel circuit PC2 to the light emitting diode ED. The first pixel circuit PC1 (or the first circuit layer 110) according to one example embodiment may include a driving transistor Tdr, a first light emitting control transistor Tec1, a second light emitting control transistor Tec2, and a storage capacitor Cst.

The driving transistor Tdr outputs the data current corresponding to the gate-source voltage based on the data signal supplied from the second pixel circuit PC2. The driving transistor Tdr according to one example embodiment may include a gate electrode connected to a third node N3, a first source-drain electrodes connected to a first node N1, and second source-drain electrodess connected to a second node N2. For example, in the driving transistor Tdr, the first source-drain electrodes may be a source electrode, and the second source-drain electrodes may be a drain electrode. The driving transistor Tdr may turn on based on the gate-source voltage to form a current path between the first node N1 and the second node N2, and outputs the data current corresponding to the gate-source voltage to the second node N2.

The first light emitting control transistor Tec1 may turn on based on the light emitting control signal to supply a pixel driving voltage to the first node N1. The first light emitting control transistor Tec1 according to one example embodiment may include a gate electrode connected to the light emitting control line ECL, first source-drain electrodes connected to the pixel driving power line PL, and second source-drain electrodes connected to the first node N1. The gate electrode of the first light emitting control transistor Tec1 may be a first area of the light emitting control line ECL or a first protrusion area protruded from the first area of the light emitting control line ECL. In the first light emitting control transistor Tec1, the first source-drain electrodes may be a source electrode, and the second source-drain electrodes may be a drain electrode. The first light emitting control transistor Tec1 may be turned on based on the light emitting control signal supplied from the light emitting control line ECL to form a current path between the pixel driving power line PL and the first node N1. The first light emitting control transistor Tec1 may also supply the pixel driving power source supplied from the pixel driving power line PL to the first source-drain electrodes of the driving transistor Tdr through the first node N1.

The second light emitting control transistor Tec2 may turn on based on the light emitting control signal to form a current path between the second node N2 and the fourth node N4. The second light emitting control transistor Tec2 according to one example embodiment may include a gate electrode connected to the light emitting control line ECL, first source-drain electrodes connected to the second node N2, and second source-drain electrodes connected to the fourth node N4. The gate electrode of the second light emitting control transistor Tec2 may be a second area of the light emitting control line ECL spaced apart from the first area of the light emitting control line ECL or a second protrusion area protruded from the second area of the light emitting control line ECL. In the second light emitting control transistor Tec2, the first source-drain electrodes may be a source electrode, and the second source-drain electrodes may be a drain electrode. The second light emitting control transistor Tec2 may turn on based on the light emitting control signal supplied from the light emitting control line ECL to form a current path between the second node N2 and the fourth node N4. The second light emitting control transistor Tec2 may also supply the data current supplied from the driving transistor Tdr to the light emitting diode ED through the fourth node N4.

Each of the driving transistor Tdr, the first light emitting control transistor Tec1 and the second light emitting control transistor Tec2 may include a semiconductor layer including an amorphous silicon material, a polysilicon material or an oxide semiconductor material. Each of the driving transistor Tdr, the first light emitting control transistor Tec1 and the second light emitting control transistor Tec2 may be a P type thin film transistor that includes a semiconductor layer doped with P type impurities. That is, each of the transistors may be modified to an N type thin film transistor that includes a semiconductor layer doped with N type impurities. The polysilicon material has excellent reliability with respect to strong bias stress, and has high electron mobility. Therefore, each of the driving transistor Tdr, the first light emitting control transistor Tec1 and the second light emitting control transistor Tec2 may be a P type thin film transistor that includes a semiconductor layer of a polysilicon material doped with P type impurities.

The storage capacitor Cst stores a differential voltage between the gate electrode and the source electrode of the driving transistor Tdr. For example, the storage capacitor Cst stores a data voltage supplied from the second pixel circuit PC2 and a characteristic compensation voltage of the driving transistor Tdr. The storage capacitor Cst according to one example embodiment may include a first capacitor electrode Ec1 connected with the gate electrode of the driving transistor Tdr and a second capacitor electrode Ec2 overlapped with the first capacitor electrode Ec1 and supplied with a pixel driving voltage.

The first capacitor electrode Ec1 may include the gate electrode of the driving transistor Tdr on a capacitor area defined in the first circuit layer 110. The second capacitor electrode Ec2 may be on the capacitor area defined in the first circuit layer 110 to overlap the first capacitor electrode Ec1, and may be electrically connected with the pixel driving power line PL. The first capacitor electrode Ec1 and the second capacitor electrode Ec2 may be overlapped with each other by interposing a gate insulating layer therebetween. Therefore, the storage capacitor Cst may be formed on the gate insulating layer between the first capacitor electrode Ec1 and the second capacitor electrode Ec2.

The first pixel circuit PC1 (or the first circuit layer 110) according to one example embodiment may further include a first line contact hole H1c1 and a second line contact hole H1c2. The first line contact hole H1c1 electrically connects the pixel driving power line PL with the first source-drain electrodes of the first light emitting control transistor Tec1. That is, the pixel driving power line PL may be electrically connected with the first source-drain electrodes of the first light emitting control transistor Tec1 through the first line contact hole H1c1. The second line contact hole H1c2 electrically connects the pixel driving power line PL with the second capacitor electrode Ec2. That is, the pixel driving power line PL may be electrically connected with the second capacitor electrode Ec2 through the second line contact hole H1c2.

The first pixel circuit PC1 (or the first circuit layer 110) according to one example embodiment may further include first to fourth node connection patterns Pnc1, Pnc2, Pnc3 and Pnc4 electrically connected with the first to fourth nodes N1, N2, N3 and N4, respectively. Each of the first to fourth node connection patterns Pnc1, Pnc2, Pnc3 and Pnc4 is on the uppermost surface of the first circuit layer 110 and covered by the circuit insulating layer 130. The first to fourth node connection patterns Pnc1, Pnc2, Pnc3 and Pnc4 are respectively formed in an island shape to be electrically separated from one another, and are formed of the same conductive material as that of the pixel driving power line PL.

The first node connection pattern Pnc1 is on the uppermost surface of the first circuit layer 110 overlapped with the first node N1 and electrically connected with the first node N1. The second node connection pattern Pnc2 is on the uppermost surface of the first circuit layer 110 overlapped with the second node N2 and electrically connected with the second node N2. The third node connection pattern Pnc3 is on the uppermost surface of the first circuit layer 110 overlapped with the third node N3 and electrically connected with the third node N3. The fourth node connection pattern Pnc4 is on the uppermost surface of the first circuit layer 110 overlapped with the fourth node N4 and electrically connected with the fourth node N4.

The first pixel circuit PC1 (or the first circuit layer 110) according to one example embodiment may be defined as a current supply circuit that supplies a data current to the light emitting diode ED. In the first pixel circuit PC1 (or the first circuit layer 110), the storage capacitor Cst may be a voltage storage circuit for storing a voltage corresponding to the data current supplied to the light emitting diode ED. The driving transistor Tdr may be a current output circuit for supplying the data current to the light emitting diode ED. The first light emitting control transistor Tec1 and the second light emitting control transistor Tec2 may be current path formation circuits.

The circuit insulating layer 130 is on the substrate 10, covers the first circuit layer 110, and electrically insulates (or separates) the first circuit layer 110 from the second circuit layer 150. The circuit insulating layer 130 may be made of an organic insulating material or an inorganic insulating material. The circuit insulating layer 130 according to one example embodiment may be formed at a relatively thick thickness to provide a planarization surface (or flat surface) on the first circuit layer 110. The circuit insulating layer 130 according to another example embodiment may be formed at a relatively thin thickness to have a shape that follows a surface shape of the first circuit layer 110 as it is.

The second circuit layer 150 may overlap with the first circuit layer 110 and include a data supply transistor Tds for supplying the data signal to the first pixel circuit PC1 of the first circuit layer 110. The second circuit layer 150 may be on the circuit insulating layer 130 to overlap the first circuit layer 110. The second circuit layer 150 may be between the substrate 10 and the circuit insulating layer 130, that is, below the first circuit layer 110. However, the semiconductor layer of the driving transistor Tdr is on the second circuit layer 150, whereby driving characteristic of the driving transistor Tdr may be deteriorated. Therefore, the first circuit layer 110 including the driving transistor Tdr may be between the substrate 10 and the circuit insulating layer 130 to form the semiconductor layer of the driving transistor Tdr in a plane structure. It is not required to provide the planarization surface on the first circuit layer 110 through the circuit insulating layer 130. If the first circuit layer 110 is on the second circuit layer 150, the first circuit layer 110 provides a planarization surface on the second circuit layer 150 by using the thickness of the circuit insulating layer 130 to form the semiconductor layer of the driving transistor Tdr in a plane structure.

The second circuit layer 150 according to one example embodiment may include a second pixel circuit PC2, a data line DL for supplying a data signal to the second pixel circuit PC2, an initialization control line ICL for supplying an initialization control signal to the second pixel circuit PC2, a scan control line SCL for supplying a scan control signal to the second pixel circuit PC2, and an initialization voltage line IVL for supplying an initialization voltage to the second pixel circuit PC2. The data line DL is at one side corner of the pixel P to be parallel with the second direction Y. The data line DL according to one example embodiment may be at one side corner of the pixel P to two-dimensionally overlap or not to two-dimensionally overlap the pixel driving power line PL on the first circuit layer 110. For example, the data line DL may be at one side corner of the pixel P so as not to overlap the pixel driving power line PL on the first circuit layer 110.

The initialization control line ICL is on the first area of the pixel P and is parallel with the first direction X. The initialization control line ICL according to one example embodiment may be on the first area of the pixel P to two-dimensionally overlap or not to two-dimensionally overlap the light emitting control line ECL on the first circuit layer 110. For example, the initialization control line ICL may be on the first area of the pixel P so as not to overlap the light emitting control line ECL on the first circuit layer 110.

The scan control line SCL is on a second area of the pixel P to be spaced apart from the initialization control line ICL in parallel with the initialization control line ICL. The second area of the pixel P may be defined as an intermediate area of the pixel based on the second direction Y. The scan control line SCL according to one example embodiment may be on the second area of the pixel P to two-dimensionally overlap or not to two-dimensionally overlap the light emitting control line ECL on the first circuit layer 110. For example, the scan control line SCL may be on the second area of the pixel P so as not to overlap the light emitting control line ECL on the first circuit layer 110. The initialization voltage line IVL is at the other corner of the pixel P to be parallel with the data line DL. The other corner of the pixel P may be defined as a right corner area of the pixel based on the first direction X.

The second pixel circuit PC2 initializes a voltage of each of the third node N3 and the fourth node N4 of the first pixel circuit PC1 and supplies a data signal supplied from the data line DL to the first pixel circuit PC1 of the first circuit layer 110. The second pixel circuit PC2 (or the second circuit layer 150) according to one example embodiment may include a data supply transistor Tds, a first initialization transistor Ti1, a second initialization transistor Ti2, and a sampling transistor Ts. The second pixel circuit PC2 (or the second circuit layer 150) according to one example embodiment may further include first' to fourth' nodes N1', N2', N3' and N4'. Each of the first' to fourth' nodes N1', N2', N3' and N4' may be overlapped with each of the first to fourth nodes N1, N2, N3 and N4 of the first circuit layer 110, or may be overlapped with each of the first to fourth node connection patterns Pnc1, Pnc2, Pnc3 and Pnc4 of the first circuit layer 110. The first to fourth nodes N1, N2, N3 and N4 of the first circuit layer 110 may be defined as first to fourth lower nodes, respectively, and the first' to fourth' nodes N1', N2', N3' and N4' may be defined as first to fourth upper nodes, respectively.

The data supply transistor Tds may turn on based on the scan control signal to supply the data signal supplied from the data line DL to the first node N1 of the first pixel circuit PC1. The data supply transistor Tds according to one example embodiment may include a gate electrode connected to the scan control line SCL, first source-drain electrodes connected to the data line DL, and second source-drain electrodes connected to the first' node N1'. The gate electrode of the data supply transistor Tds may be a first area of the scan control line SCL or a first protrusion area protruded from the first area of the scan control line SCL. In the data supply transistor Tds, the first source-drain electrodes may be a source electrode, and the second source-drain electrodes may be a drain electrode. The data supply transistor Tds may turn on based on the scan control signal supplied from the scan control line SCL to form a current path between the data line DL and the first node N1. The data supply transistor Tds may also supply the data signal supplied from the data line DL to the first source-drain electrodes of the driving transistor Tdr through the first' node N1'.

The first initialization transistor Ti1 may turn on based on the initialization control signal to supply the initialization voltage supplied from the initialization voltage line IVL to the third node N3 of the first pixel circuit PC1. The first initialization transistor Ti1 according to one example embodiment may include a gate electrode connected to the initialization control line ICL, first source-drain electrodes connected to the initialization voltage line IVL, and second source-drain electrodes connected to the third' node N3'. The gate electrode of the first initialization transistor Ti1 may be a first area of the initialization control line ICL or a first protrusion area protruded from the first area of the initialization control line ICL. In the first initialization transistor Ti1, the first source-drain electrodes may be a source electrode, and the second source-drain electrodes may be a drain electrode. The first initialization transistor Ti1 may turn on based on the initialization control signal supplied from the initialization control line ICL to form a current path between the initialization voltage line IVL and the third' node N3'. The first initialization transistor Ti1 may also supply the initialization control signal supplied from the initialization control line ICL to the gate electrode of the driving transistor Tdr connected to the third node N3 of the first pixel circuit PC1.

The second initialization transistor Ti2 may turn on based on the initialization control signal to supply the initialization voltage supplied from the initialization voltage line IVL to the fourth node N4 of the first pixel circuit PC1. The second initialization transistor Ti2 according to one example embodiment may include a gate electrode connected to the initialization control line ICL, first source-drain electrodes connected to the initialization voltage line IVL, and second source-drain electrodes connected to the fourth' node N4'. The gate electrode of the second initialization transistor Ti2 may be a second area of the initialization control line ICL or a second protrusion area protruded from the second area of the initialization control line ICL. In the second initialization transistor Ti2, the first source-drain electrodes may be a drain electrode, and the second source-drain electrodes may be a source electrode. The second initialization transistor Ti2 may turn on based on the initialization control signal supplied from the initialization control line ICL to form a current path between the initialization voltage line IVL and the fourth' node N4'. The second initialization transistor Ti2 may also supply the initialization voltage supplied from the initialization voltage line IVL to the fourth node N4 of the first pixel circuit PC1 through the fourth' node N4'.

The sampling transistor Ts may turn on based on the scan control signal to electrically connect the second' node N2' with the third' node N3'. That is, the sampling transistor Ts may turn on based on the scan control signal to electrically connect the gate electrode and the drain electrode of the driving transistor Tdr provided in the first pixel circuit PC1 with each other, whereby the driving transistor Tdr may be connected in the form of a diode. The sampling transistor Ts according to one example embodiment may include a gate electrode connected to the scan control line SCL, first source-drain electrodes connected to the second' node N2', and second source-drain electrodes connected to the third' node N3'. The gate electrode of the sampling transistor Ts may be a second area of the scan control line SCL or a second protrusion area protruded from the second area of the scan control line SCL. In the sampling transistor Ts, the first source-drain electrodes may be a source electrode, and the second source-drain electrodes may be a drain electrode. The sampling transistor Ts may turn on based on the scan control signal supplied from the scan control line SCL to form a current path between the second' node N2' and the third' node N3'. The sampling transistor Ts may electrically connect the second' node N2' with the third' node N3', thereby connecting the driving transistor Tdr of the first circuit layer 110 in the form of a diode.

The sampling transistor Ts (or compensation transistor) according to another example embodiment may include a dual channel structure. That is, because the sampling transistor Ts may be electrically connected with the gate electrode of the driving transistor Tdr, the sampling transistor Ts may have a dual channel structure that can reduce and possibly minimize a leakage current to uniformly maintain the gate voltage of the driving transistor Tdr. As an example, the sampling transistor Ts may include a first sampling transistor Ts1 and a second sampling transistor Ts2, which are connected with each other in series such that the transistors may simultaneously turn on based on the scan control signal.

The first sampling transistor Ts1 may include a gate electrode connected to the scan control line SCL, first source-drain electrodes connected to the third' node N3', and second source-drain electrodes connected to the second sampling transistor Ts2. In the first sampling transistor Ts1, the gate electrode may be a second area of the scan control line SCL or a second protrusion area protruded from the second area of the scan control line SCL. Also, the first source-drain electrodes may be a drain electrode, and the second source-drain electrodes may be a source electrode.

The second sampling transistor Ts2 may include a gate electrode connected to the scan control line SCL, first source-drain electrodes connected to the second source-drain electrodes of the first sampling transistor Ts1, and second source-drain electrodes connected to the second' node N2'. In the second sampling transistor Ts2, the gate electrode may be a third area of the scan control line SCL or a third protrusion area protruded from the third area of the scan control line SCL. Also, the first source-drain electrodes may be a drain electrode, and the second source-drain electrodes may be a source electrode.

Each of the data supply transistor Tds, the first initialization transistor Ti1, the second initialization transistor Ti2 and the sampling transistor Ts may include a semiconductor layer containing an amorphous silicon material, a polysilicon material or an oxide semiconductor material, and may be a P type thin film transistor that includes a semiconductor layer doped with P type impurities. That is, each of the transistors may be modified to an N type thin film transistor that includes a semiconductor layer doped with N type impurities. Each of the transistors Tds, Ti1, Ti2 and Ts constituting the second pixel circuit PC2 according to one example embodiment may be a P type thin film transistor that includes a semiconductor layer of a polysilicon material doped with P type impurities.

The second pixel circuit PC2 (or the second circuit layer 150) according to one example embodiment may further include a third line contact hole H1c3 and a fourth line contact hole H1c4. The third line contact hole H1c3 electrically connects the data line DL with the first source-drain electrodes of the data supply transistor Tds. That is, the data line DL may be electrically connected with the first source-drain electrodes of the data supply transistor Tds through the third line contact hole H1c3. The fourth line contact hole H1c4 electrically connects each of the first source-drain electrodes of the first initialization transistor Ti1 and the first source-drain electrodes of the second initialization transistor Ti2 with the initialization voltage line IVL. That is, the initialization voltage line IVL may be electrically connected with each of the first source-drain electrodes of the first initialization transistor Ti1 and the first source-drain electrodes of the second initialization transistor Ti2 through the fourth line contact hole H1c4.

The second circuit layer 150 according to one example embodiment may further include first to fourth circuit connectors Cc1 to Cc4 that electrically connect the first pixel circuit PC1 with the second pixel circuit PC. The first to fourth circuit connectors Cc1 to Cc4 are respectively formed in the second circuit layer 150 in an island shape to be electrically separated from one another, and are simultaneously formed of the same conductive material as one another.

The first circuit connector Cc1 electrically connects the first node N1 of the first pixel circuit PC1 with the first' node N1' of the second pixel circuit PC2. That is, one side of the first circuit connector Cc1 may be electrically connected with the first' node N1' of the second pixel circuit PC2, and the other side of the first circuit connector Cc1 may be electrically connected with the first node connection pattern Pnc1 of the first circuit layer 110 by passing through the circuit insulating layer 130. Therefore, the first node N1 of the first pixel circuit PC1 on the first circuit layer 110 may be electrically connected with the first' node N1' of the second pixel circuit PC2 on the second circuit layer 150 through the first node connection pattern Pnc1 and the first circuit connector Cc1.

The second circuit connector Cc2 electrically connects the second node N2 of the first pixel circuit PC1 with the second' node N2' of the second pixel circuit PC2. That is, one side of the second circuit connector Cc2 may be electrically connected with the second' node N2' of the second pixel circuit PC2, and the other side of the second circuit connector Cc2 may be electrically connected with the second node connection pattern Pnc2 of the first circuit layer 110 by passing through the circuit insulating layer 130. Therefore, the second node N2 of the first pixel circuit PC1 on the first circuit layer 110 may be electrically connected with the second' node N2' of the second pixel circuit PC2 on the second circuit layer 150 through the second node connection pattern Pnc2 and the second circuit connector Cc2.

The third circuit connector Cc3 electrically connects the third node N3 of the first pixel circuit PC1 with the third' node N3' of the second pixel circuit PC2. One side of the third circuit connector Cc3 according to one example embodiment may be electrically connected with the third' node N3' of the second pixel circuit PC2. The other side of the third circuit connector Cc3 may be electrically connected with the third node connection pattern Pnc3 of the first circuit layer 110 by passing through the circuit insulating layer 130. Therefore, the third node N3 of the first pixel circuit PC1 on the first circuit layer 110 may be electrically connected with the second' node N2' of the second pixel circuit PC2 on the second circuit layer 150 through the third node connection pattern Pnc3 and the third circuit connector Cc3. The other side of the third circuit connector Cc3 according to another example embodiment may be electrically connected with the first capacitor electrode Ec1 on the first circuit layer 110 by passing through the circuit insulating layer 130. The third node connection pattern Pnc3 of the first circuit layer 110 may be omitted.

The fourth circuit connector Cc4 electrically connects the fourth node N4 of the first pixel circuit PC1 with the fourth' node N4' of the second pixel circuit PC2. That is, one side of the fourth circuit connector Cc4 may be electrically connected with the fourth' node N4' of the second pixel circuit PC2, and the other side of the fourth circuit connector Cc4 may be electrically connected with the fourth node connection pattern Pnc4 of the first circuit layer 110 by passing through the circuit insulating layer 130. Therefore, the fourth node N4 of the first pixel circuit PC1 on the first circuit layer 110 may be electrically connected with the fourth' node N4' of the second pixel circuit PC2 on the second circuit layer 150 through the fourth node connection pattern Pnc4 and the fourth circuit connector Cc4.

The second pixel circuit PC2 (or the second circuit layer 150) according to one example embodiment may electrically connect the second and third nodes N2 and N3 of the first pixel circuit PC1 with each other. The second pixel circuit PC2 (or the second circuit layer 150) may also supply the data signal to the first pixel circuit PC1 in response to the scan control signal, and may initialize the voltage of each of the third and fourth nodes N3 and N4 of the first pixel circuit PC1 in response to the initialization control signal. Therefore, in the second pixel circuit PC2 (or the second circuit layer 150), the data supply transistor Tds may be defined as a data supply circuit, the first initialization transistor Ti1 and the second initialization transistor Ti2 may be defined as pixel initialization circuits, and the sampling transistor Ts may be defined as an internal compensation circuit.

The light emitting layer 170 may include a light emitting diode ED electrically connected with the first pixel circuit PC1 to emit light based on the data current supplied from the first pixel circuit PC1. The light emitting diode ED according to one example embodiment may include a pixel driving electrode AE (or anode electrode) connected to the pixel circuit PC, a light emitting layer EL formed on the pixel driving electrode AE, and a common electrode layer CE (or cathode electrode) electrically connected to the light emitting layer EL.

The pixel driving electrode AE is on the opening area of the pixel P, and may be electrically connected with the fourth node N4 of the first pixel circuit PC1, more specifically the fourth' node N4' of the second pixel circuit PC2. The pixel driving electrode AE according to one example embodiment may include a metal material having high reflectivity. For example, the pixel driving electrode AE may include a multi-layered structure. The multi-layered structure may be a deposition structure (Ti/Al/Ti) of Al and Ti, a deposition structure (ITO/Al/ITO) of Al and ITO, an APC (Ag/Pd/Cu) alloy, a deposition structure (ITO/APC/ITO) of APC alloy and ITO. Alternatively, the pixel driving electrode AE may include a single layered structure made of any one material or two or more alloy materials selected from Ag, Al, Mo, Au, Mg, Ca and Ba. A corner of the pixel driving electrode AE may be covered by a bank pattern BNK. The bank pattern BNK is on the other pixel areas except the opening area of the pixel P to cover the corner of the pixel driving electrode AE, thereby defining the opening area of the pixel P. The bank pattern BNK according to one example embodiment may be defined in a pentile structure or a stripe structure.

The light emitting layer EL according to one example embodiment may be formed on the entire display area of the substrate 10 to cover the pixel driving electrode AE and the bank pattern BNK 127. The light emitting layer EL according to one example embodiment includes two or more light emitting portions for emitting white light. For example, the light emitting layer EL according to one example embodiment may include first and second light emitting portions for emitting white light through a mixture of the first light and the second light. The first light emitting portion emits the first light, and may include any one of a blue light emitting portion, a green light emitting portion, a red light emitting portion, a yellow light emitting portion, and a cyan light emitting portion. The second light emitting portion may include a light emitting portion for emitting the second light having a complementary color of the first light among the blue light emitting portion, the green light emitting portion, the red light emitting portion, the yellow light emitting portion, and the cyan light emitting portion.

The light emitting layer EL according to another example embodiment may include any one of a blue light emitting portion, a green light emitting portion, and a red light emitting portion to emit colored light correspond to the color set in the pixel P. For example, the light emitting layer EL according to another example embodiment may include any one of an organic light emitting layer, an inorganic light emitting layer, and a quantum-dot light emitting layer, or may include a deposition or mixture structure of the organic light emitting layer (or inorganic light emitting layer) and the quantum-dot light emitting layer. Additionally, the light emitting diode ED according to one example embodiment may further include a function layer for improving emission efficiency and/or lifespan of the light emitting layer EL. The common electrode layer CE may be electrically connected with the light emitting layer EL. The common electrode layer CE may be on the entire display area of the substrate 10 to be electrically connected with the light emitting layer EL provided with each pixel area PA.

The common electrode layer CE according to one example embodiment may include a transparent conductive material, which may transmit light, or a semi-transmissive conductive material. If the common electrode layer CE is formed of a semi-transparent conductive material, light emission efficiency of light emitted from the light emitting diode ED may be enhanced through a micro cavity. The semi-transmissive conductive material according to one example embodiment may include Mg, Ag, or alloy of Mg and Ag. Additionally, a capping layer for improving emission efficiency of light by controlling a refractive index of light emitted from the light emitting diode ED may further be formed on the common electrode layer CE.

The light emitting layer EL according to another example embodiment may include a micro light emitting diode implemented in the form of an integrated circuit. The micro light emitting diode may include a first terminal electrically connected to the pixel driving electrode AE and a second terminal electrically connected with the common electrode layer CE. The pixel P according to one example embodiment may further include a planarization layer 160 covering the second circuit layer 150 and an encapsulation layer 190 covering the light emitting diode layer 170. The planarization layer 160 is on the substrate 10 to cover the second circuit layer 150, thereby providing a planarization surface on the second circuit layer 150. The light emitting diode layer 170 is on the planarization layer 160. The pixel driving electrode AE of the light emitting diode layer 170 may be electrically connected with the fourth node N4 of the first pixel circuit PC1, more specifically the fourth' node N4' of the second pixel circuit PC2 through an electrode contact hole provided on the planarization layer 160.

The encapsulation layer 190 is on the substrate 10 to surround the light emitting diode layer 170. The encapsulation layer 190 serves to prevent oxygen or water from being permeated into the light emitting diode layer ED. The encapsulation layer 190 according to one example embodiment may include at least one inorganic film for preventing or minimizing oxygen or water permeation, and an organic film covering particles which may occur during a manufacturing process. For example, the encapsulation layer 190 may include a first inorganic film, an organic film on the first inorganic film, and a second inorganic film on the organic film.

Additionally, the pixel P according to one example embodiment may include a black matrix overlapped with the bank pattern BNK and a wavelength conversion layer on the opening area. The black matrix is on the encapsulation layer 190 to overlap the bank pattern BNK. The wavelength conversion layer according to one example embodiment includes a color filter on the encapsulation layer 190 overlapped with the opening area of the pixel P to transmit only a wavelength of a color set in the pixel from white light from the light emitting diode ED. For example, the wavelength conversion layer may transmit only a wavelength of red, green or blue. This wavelength conversion layer may be omitted if the light emitting layer EL of the light emitting diode ED includes a light emitting layer emitting light of red, green and blue.

The pixel P according to one example embodiment may further include a barrier film and a light path controlling layer 180. The barrier film may be attached onto the encapsulation layer 190 by means of an adhesive layer. The barrier film prevents water or oxygen permeation, and may be made of a material of low water permeability. The light path controlling layer 180 controls a path of incident light. The light path controlling layer 180 according to one example embodiment may include a plurality of refractive layers. The plurality of refractive layers may have their respective refractive indexes different from each other. The light path controlling layer 180 may have a structure that a high refractive layer and a low refractive layer are alternately deposited. The light path controlling layer 180 according to one example embodiment minimizes color shift according to a viewing angle by changing a path of incident light.

The light path controlling layer 180 according to another example embodiment may be a polarizing layer. The polarizing layer improves visibility and a contrast ratio by changing external light reflected by the thin film transistor and/or lines provided in the pixel P to a circularly polarized light state. An operation of the pixel according to one example embodiment will be described as follows.

The pixel P according to one example embodiment may operate for an initialization period, a sampling period, and a light emitting period. For example, one frame of the light emitting display apparatus may include an initialization period for initializing the second node N2 and the third node N3. The frame may further include a sampling period for storing a sampling voltage corresponding to a characteristic value (or threshold voltage) of the driving transistor Tdr in the third node N3. The frame may further include a light emitting period for storing a gate-source voltage of the driving transistor Tdr, which includes a data signal and a sampling voltage, in the storage capacitor Cst. The light emitting diode ED may emit light based on the data current corresponding to the voltage of the storage capacitor Cst.

In the initialization period, the initialization control signal supplied to the initialization control line ICL has a transistor-on voltage level, the light emitting control signal supplied to the light emitting control line ECL has a transistor-off voltage level, and the scan control signal supplied to the scan control line SCL has a transistor-off voltage level. Therefore, for the initialization period, the first and second initialization transistors Ti1 and Ti2 may turn on based on the initialization control signal of the transistor-on voltage level, whereby each of the second node N2 and the third node N3 is initialized to the initialization voltage.

In the sampling period, the initialization control signal supplied to the initialization control line ICL has a transistor-off voltage level, the light emitting control signal supplied to the light emitting control line ECL has a transistor-off voltage level, and the scan control signal supplied to the scan control line SCL has a transistor-on voltage level. Therefore, for the sampling period, the sampling transistor Ts may turn on based on the scan control signal of the transistor-on voltage level, whereby the second node N2 and the third node N3 are electrically connected and thus the driving transistor Tdr may be connected in the form of a diode. At the same time, the data supply transistor Tds may turn on based on the scan control signal of the transistor-on voltage level, whereby the data signal supplied to the data line DL may be supplied to the third node N3. For this sampling period, a potential of the second node N2 may become high by a current flowing between the first source-drain electrodes and the second source-drain electrodes of the driving transistor Tdr by the voltage of the third node N3. As such, the potential of the third node N3 may increase to reach a voltage. This voltage is obtained by subtracting the voltage according to the data signal and the characteristic voltage of the driving transistor Tdr from the initialization voltage and a differential voltage between the gate voltage and the source voltage of the driving transistor Tdr, according to the potential of the third node N3 stored in the storage capacitor Cst. The initialization voltage has a voltage level equal to or lower than a common power source Vss supplied to the common electrode layer CE.

In the light emitting period, the initialization control signal supplied to the initialization control line ICL has a transistor-off voltage level, the light emitting control signal supplied to the light emitting control line ECL has a transistor-on voltage level, and the scan control signal supplied to the scan control line SCL has a transistor-off voltage level. Therefore, for the light emitting period, the first and second light emitting control transistors Tec1 and Tec2 may turn on based on the light emitting control signal of the transistor-on voltage level. The pixel driving power source supplied from the pixel driving power line may be applied to the first source-drain electrodes of the driving transistor Tdr through the turned-on first light emitting control transistor Tec1. Thus, the data current according to the voltage difference between the gate voltage and the pixel driving voltage of the driving transistor Tdr may be supplied to the light emitting diode ED through the turned-on second light emitting control transistor Tec2. For the light emitting period, the gate-source voltage Vgs of the driving transistor Tdr may be maintained at "(Vdata−Vth)−Vdd" by the storage capacitor Cst. The current flowing to the driving transistor Tdr is proportional to a square value (Vdata−Vdd)$^2$ of a value obtained by a threshold voltage from the source-gate voltage Vsg of the driving transistor Tdr. The current flowing to the light emitting diode ED may be determined by the data voltage Vdata according to the data signal regardless of the threshold voltage Vth of the driving transistor Tdr.

Figure 5:
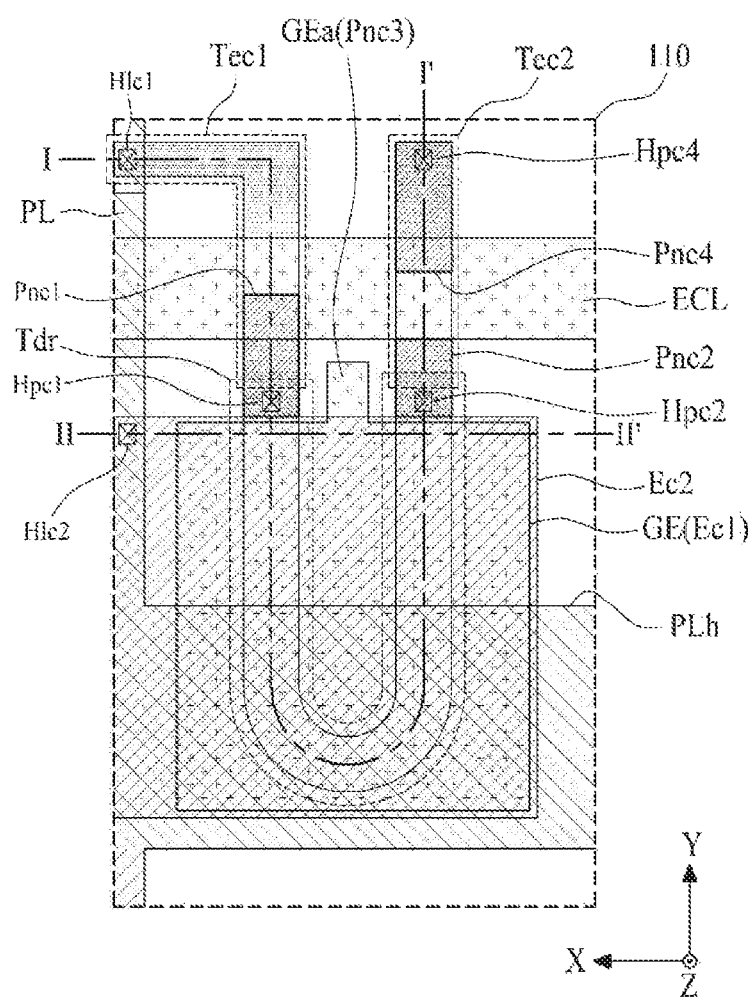
FIG. 5 illustrates a layout of a first circuit layer shown in FIG. 4.
Figure 6:
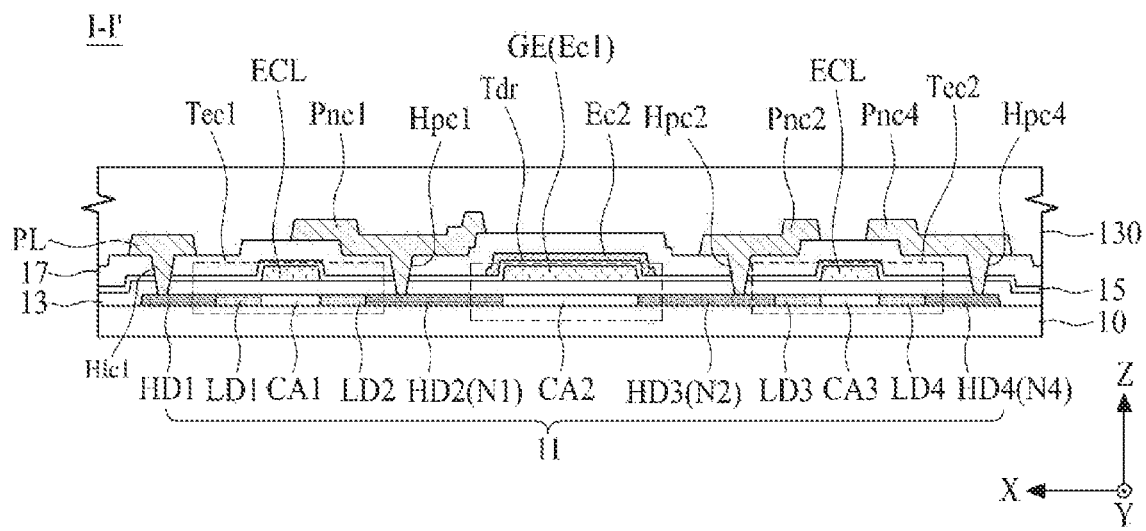
FIG. 6 is a cross-sectional view along line I-I' shown in FIG. 5.
Figure 7:
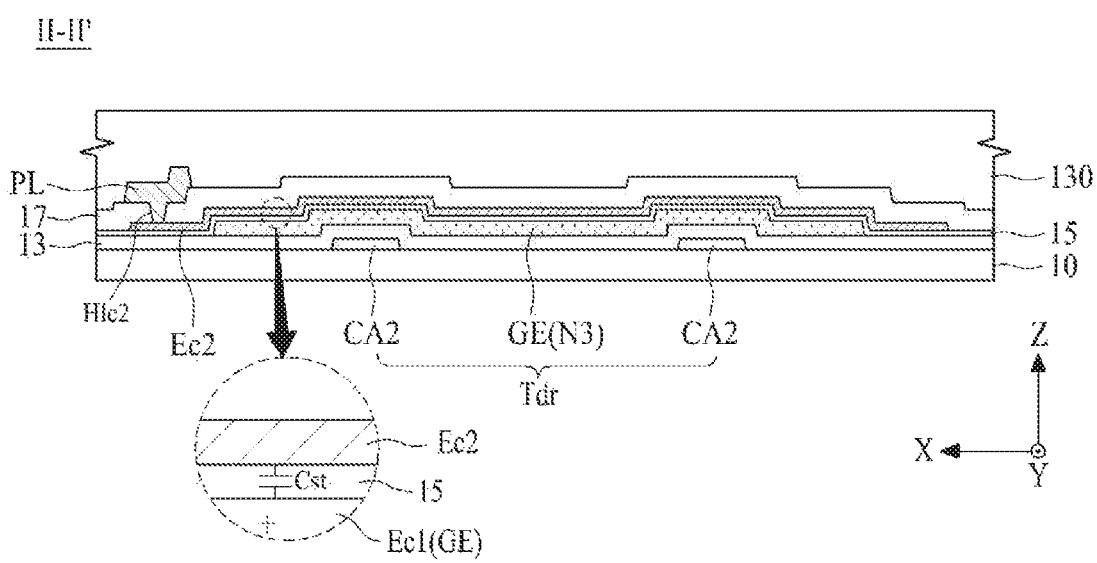
FIG. 7 is a cross-sectional view along line II-II' shown in FIG. 5.

FIG. 5 illustrates a layout of a first circuit layer shown in FIG. 4. FIG. 6 is a cross-sectional view along line I-I' shown in FIG. 5. FIG. 7 is a cross-sectional view along line shown in FIG. 5. As illustrated in FIGS. 4 to 7, the first circuit layer 110 of the pixel may include a substrate 10, a first semiconductor layer 11, a first gate insulating layer 13, a light emitting control line ECL, a gate electrode GE, a first inter-layer dielectric layer 15, a second capacitor electrode Ec2, a first protective layer 17, a first line contact hole H1c1, a second line contact hole H1c2, a first pattern contact hole Hpc1, a second pattern contact hole Hpc2, a fourth pattern contact hole Hpc4, a pixel driving power line PL, a first node connection pattern Pnc1, a second node connection pattern Pnc2, and a fourth node connection pattern Pnc4.

The substrate 10 may include a first light emitting control transistor area, a second light emitting control transistor area, a driving transistor area and a capacitor area, which are defined in the pixel area. The first semiconductor layer 11 may be on the pixel area of the substrate 10 to pass through the first light emitting control transistor area, the second light emitting control transistor area, the driving transistor area and the capacitor area. The first semiconductor layer 11 may include a polysilicon material. For example, the first semiconductor layer 11 may be on the pixel area of the substrate 10 to have a two-dimensional "U" shape.

The first semiconductor layer 11 may include first to third channel areas CAL CA2 and CA3. The first semiconductor layer 11 may further include first and second lightly doped areas LD1 and LD2 formed in parallel with each other by interposing the first channel area CA1. The first semiconductor layer 11 may further include third and fourth lightly doped areas LD3 and LD4, that may be formed in parallel with each other by interposing the third channel area CA3. The first semiconductor layer 11 may further include a first heavily doped area HD1 adjacent to the first lightly doped area LD1, and a second heavily doped area HD2 formed between the second channel area CA2. The first semiconductor layer 11 may further include the second lightly doped area LD2, a third heavily doped area HD3 formed between the second channel area CA2 and the third lightly doped area LD3, and a fourth heavily doped area HD4 adjacent to the fourth lightly doped area LD4. The first and third channel areas CA1 and CA3 of the first semiconductor layer 11 may be formed in parallel with each other to have a two-dimensional "I" shape, and the second channel area CA2 of the first semiconductor layer 11 may be formed between the first and third channel areas CA1 and CA3 to have a two-dimensional "U" shape.

Each of the first to fourth heavily doped areas HD1, HD2, HD3 and HD4 of the first semiconductor layer 11 may be defined as an area having an impurity doping concentration higher than that of each of the first to fourth lightly doped areas LD1, LD2, LD3 and LD4. The first heavily doped region HD1 of the first semiconductor layer 11 may be used as the first source-drain electrodes of the first light emitting control transistor Tec1. The second heavily doped region HD2 of the first semiconductor layer 11 may be used as the second source-drain electrodes of the first light emitting control transistor Tec1 and the first source-drain electrodes of the driving transistor Tdr, and may be defined as the first node N1 of the first pixel circuit PC1.

The third heavily doped region HD3 of the first semiconductor layer 11 may be used as the second source-drain electrodes of the driving transistor Tdr and the first source-drain electrodes of the second light emitting control transistor Tec2, and may be defined as the second node N2 of the first pixel circuit PC1. The fourth heavily doped region HD4 of the first semiconductor layer 11 may be used as the second source-drain electrodes of the second light emitting control transistor Tec2, and may be defined by the fourth node N4 of the first pixel circuit PC1.

The first gate insulating layer 13 may be formed on the entire substrate 10 to cover the first semiconductor layer 11. The first gate insulating layer 13 according to one example embodiment may be formed of a silicon oxide (SiOx), a silicon nitride (SiNx), or a multi-layered layer of SiOx and SiNx. The light emitting control line ECL may be on the first gate insulating layer 13 to overlap each of the first and third channel areas CA1 and CA3 of the first semiconductor layer 11 and extended longitudinally along the first direction X. The first area of the light emitting control line ECL overlapped with the first channel area CA1 of the first semiconductor layer 11 may serve as the gate electrode of the first light emitting control transistor Tec1. The second area of the light emitting control line ECL overlapped with the third channel area CA3 of the first semiconductor layer 11 may serve as the gate electrode of the second light emitting control transistor Tec2. Therefore, it may not be required to form a separate gate electrode protruded from the light emitting control line ECL to form the gate electrodes of the light emitting control transistors Tec1 and Tec2 in the pixel P. For this reason, a space in the pixel P for forming the gate electrode of the light emitting control transistors Tec1 and Tec2 may be saved.

The first area of the light emitting control line ECL, the first channel area CA1 of the first semiconductor layer 11, the first lightly doped area LD1, the second lightly doped area LD2, the first heavily doped area HD1, and the second heavily doped area HD2 constitute the first light emitting control transistor Tec1. The second area of the light emitting control line ECL, the third channel area CA3 of the first semiconductor layer 11, the third lightly doped area LD3, the fourth lightly doped area LD4, the third heavily doped area HD3, and the fourth heavily doped area HD4 constitute the second light emitting control transistor Tec2. The gate electrode GE may be on the first gate insulating layer 13 in an island shape to overlap the second channel area CA2 of the first semiconductor layer 11. The gate electrode GE serves as the gate electrode of the driving transistor Tdr and the first capacitor electrode Ec1 of the storage capacitor Cst, and may be defined as the third node N3 of the first pixel circuit PC1. The gate electrode GE, the second channel area CA2 of the first semiconductor layer 11, the second heavily doped area HD2 and the third heavily doped area HD3 constitute the driving transistor Tdr.

The gate electrode GE further includes a protrusion GEa. The protrusion GEa may be protruded between the second heavily doped area HD2 and the third heavily doped area HD3 from an upper side of the gate electrode GE adjacent to the light emitting control line ECL. The protrusion GEa may be defined as a contact area between the third node N3 and the second pixel circuit PC2 of the second circuit layer 150, and may be used as the third node connection pattern Pnc3. The light emitting control line ECL and the gate electrode GE may be formed of a single layer or multi-layer comprised of any one of Mo, Al, Cr, Au, Ti, Ni, Nd and Cu or their alloy. The first inter-layer dielectric layer 15 may be formed on the entire substrate to cover the light emitting control line ECL and the gate electrode GE. The first inter-layer dielectric layer 15 according to one example embodiment may be formed of a silicon oxide (SiOx), a silicon nitride (SiNx), or a multi-layered layer of SiOx and SiNx.

The second capacitor electrode Ec2 may be on the first inter-layer dielectric layer 15 to overlap the gate electrode GE of the driving transistor Tdr. The second capacitor electrode Ec2 according to one example embodiment may be formed of a single layer or multi-layer comprised of any one of Mo, Al, Cr, Au, Ti, Ni, Nd and Cu or their alloy, or may be formed of the same material as that of the gate electrode GE. The storage capacitor Cst is formed on an overlap area between the second capacitor electrode Ec2 and the gate electrode GE of the driving transistor Tdr. The first protective layer 17 may be formed on the entire substrate to cover the second capacitor electrode Ec2 and the first inter-layer dielectric layer 15. The first protective layer 17 may be formed of a silicon oxide (SiOx), a silicon nitride (SiNx), or a multi-layered layer of SiOx and SiNx.

The first line contact hole H1c1 exposes the first source-drain electrodes of the first light emitting control transistor Tec1, that is, the first heavily doped area HD1 of the first semiconductor layer 11. The first line contact hole H1c1 may pass through the first gate insulating layer 13, the first inter-layer dielectric layer 15, and the first protective layer 17. Each of these layers may be on the first heavily doped area HD1 of the first semiconductor layer 11, thereby partially exposing the first heavily doped area HD1 of the first semiconductor layer 11. The second line contact hole H1c2 may be in parallel with the first line contact hole H1c1 based on the second direction Y and may partially expose the second capacitor electrode Ec2. The second line contact hole H1c2 according to one example embodiment may be formed to pass through the first protective layer 17 on one side corner of the second capacitor electrode Ec2, thereby partially exposing one side corner of the second capacitor electrode Ec2.

The first pattern contact hole Hpc1 exposes the second source-drain electrodes (or the first source-drain electrodes of the driving transistor Tdr) of the first light emitting control transistor Tec1, that is, the second heavily doped area HD2 (or the first node N1) of the first semiconductor layer 11. The first pattern contact hole Hpc1 may pass through the first gate insulating layer 13, the first inter-layer dielectric layer 15 and the first protective layer 17, which are on the second heavily doped area HD2 of the first semiconductor layer 11, thereby partially exposing the second heavily doped area HD2 of the first semiconductor layer 11.

The second pattern contact hole Hpc2 exposes the first source-drain electrodes (or the second source-drain electrodes of the driving transistor Tdr) of the second light emitting control transistor Tec2, that is, the third heavily doped area HD3 (or the second node N2) of the first semiconductor layer 11. The second pattern contact hole Hpc2 may pass through the first gate insulating layer 13, the first inter-layer dielectric layer 15 and the first protective layer 17. These layers may be on the third heavily doped area HD3 of the first semiconductor layer 11, thereby partially exposing the third heavily doped area HD3 of the first semiconductor layer 11.

The fourth pattern contact hole Hpc4 exposes the second source-drain electrodes of the second light emitting control transistor Tec2, that is, the fourth heavily doped area HD4 (or the fourth node N4) of the first semiconductor layer 11. The fourth pattern contact hole Hpc4 according to one example embodiment may pass through the first gate insulating layer 13, the first inter-layer dielectric layer 15, and the first protective layer 17. These layers may be on the fourth heavily doped area HD4 of the first semiconductor layer 11, thereby partially exposing the fourth heavily doped area HD4 of the first semiconductor layer 11.

The pixel driving power line PL may be formed on the first protective layer 17 along the second direction Y to pass through the first line contact hole H1c1 and the second line contact hole H1c2. The pixel driving power line PL may be electrically connected with the first heavily doped area HD1 of the first semiconductor layer 11 through the first line contact hole H1c1 and thus electrically connected with the first source-drain electrodes of the first light emitting control transistor Tec1. The pixel driving power line PL may be electrically connected with a portion of one side corner of the second capacitor electrode Ec2 through the second line contact hole H1c2. The pixel driving power line PL may further include a horizontal protrusion line PLh protruded along the first direction X at a lower area of the pixel P. The horizontal protrusion line PLh may be formed to be shared by two adjacent pixels P in the first direction X.

The first node connection pattern Pnc1 may be formed on the first protective layer 17 in an island shape to overlap the first pattern contact hole Hpc1. The first node connection pattern Pnc1 may be electrically connected with the second heavily doped area HD2 of the first semiconductor layer 11 through the first pattern contact hole Hpc1 and thus electrically connected with the first node N1. That is, the first node connection pattern Pnc1 may be electrically connected with each of the second source-drain electrodes of the first light emitting control transistor Tec1 and the first source-drain electrodes of the driving transistor Tdr. The second node connection pattern Pnc2 may be formed on the first protective layer 17 in an island shape to overlap the second pattern contact hole Hpc2. The second node connection pattern Pnc2 may be electrically connected with the third heavily doped area HD3 of the first semiconductor layer 11 through the second pattern contact hole Hpc2, and thus electrically connected with the second node N2. That is, the second node connection pattern Pnc2 may be electrically connected with each of the second source-drain electrodes of the driving transistor Tdr and the first source-drain electrodes of the second light emitting control transistor Tec2.

The fourth node connection pattern Pnc4 may be formed on the first protective layer 17 in an island shape to overlap the fourth pattern contact hole Hpc4. The fourth node connection pattern Pnc4 may be electrically connected with the fourth heavily doped area HD4 of the first semiconductor layer 11 through the fourth pattern contact hole Hpc4, and thus electrically connected with the fourth node N4. That is, the fourth node connection pattern Pnc4 may be electrically connected with each of the second source-drain electrodes of the second light emitting control transistor Tec2. Each of the pixel driving power line PL, the first node connection pattern Pnc1, the second node connection pattern Pnc2, and the fourth node connection pattern Pnc4 may be formed of a single layer. The single layer may be made of any one of Mo, Al, Cr, Au, Ti, Ni, Nd and CU, and/or their alloy(s). Alternatively, the single layer may be formed of a multi-layered structure such as a deposition structure (Ti/Al/Ti) of Al and Ti, a deposition structure (ITO/Al/ITO) of Al and ITO, an APC (Ag/Pd/Cu) alloy and a deposition structure (ITO/APC/ITO) of APC alloy and ITO.

The first circuit layer 110 is covered by the circuit insulating layer 130. The circuit insulating layer 130 according to one example embodiment may be formed of a silicon oxide (SiOx), a silicon nitride (SiNx), or a multi-layered layer of SiOx and SiNx. The circuit insulating layer 130 according to another example embodiment may be formed of an organic material such as acrylic resin, epoxy resin, phenolic resin, polyamide resin, and polyimide resin.

Figure 8:
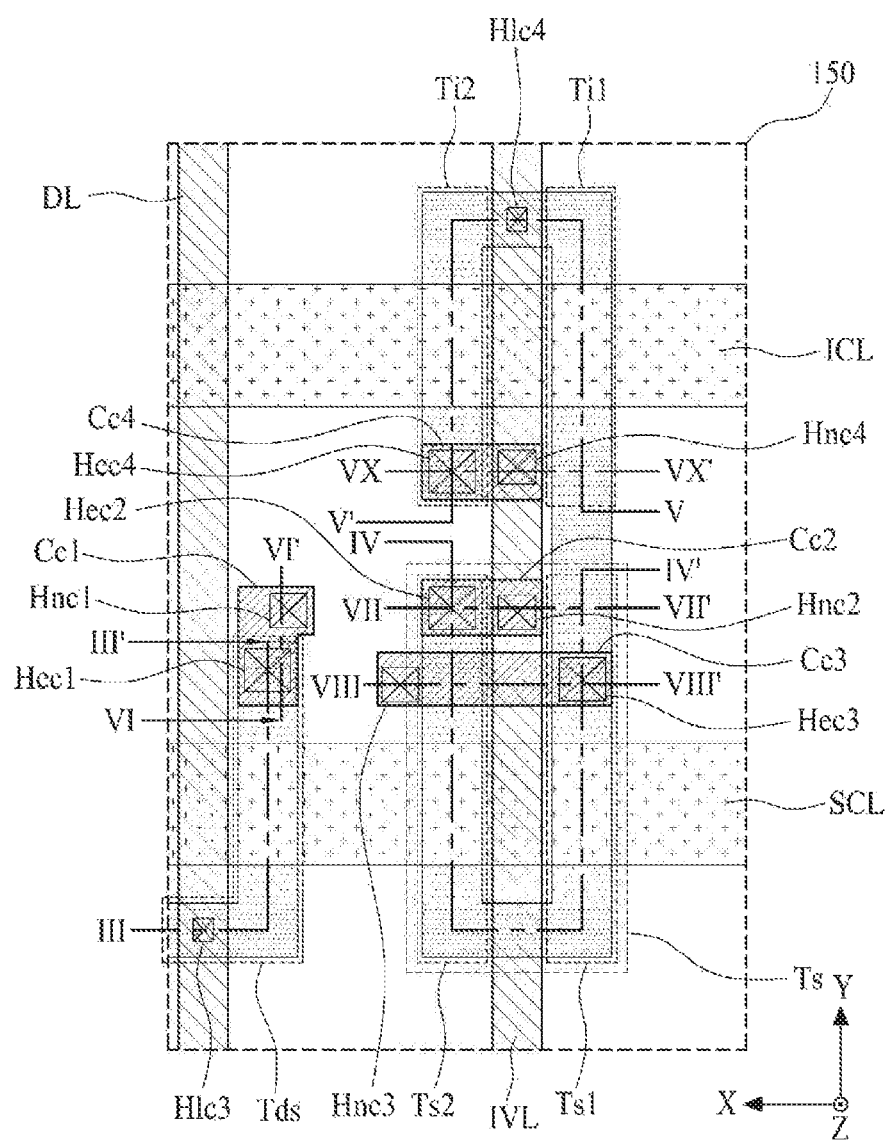
FIG. 8 illustrates a layout of a second circuit layer shown in FIG. 4.
Figure 9:
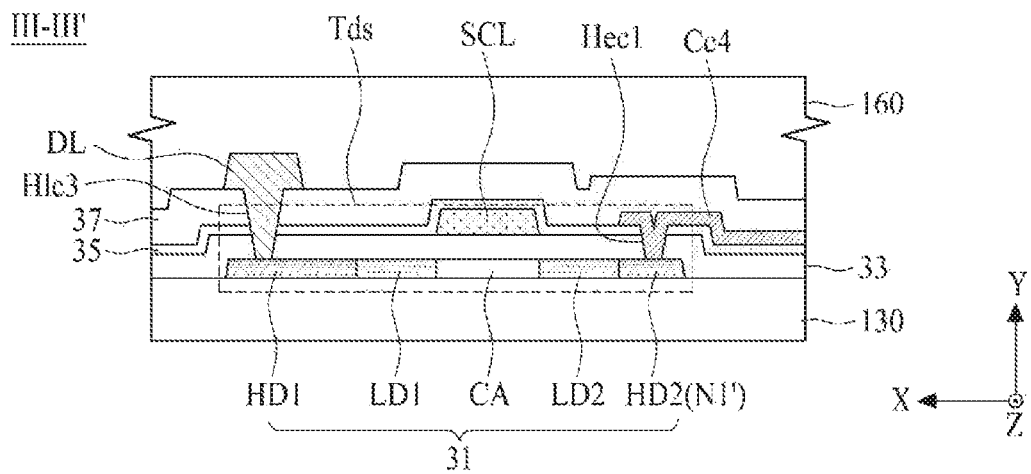
FIG. 9 is a cross-sectional view along line III-III' shown in FIG. 8.
Figure 10:
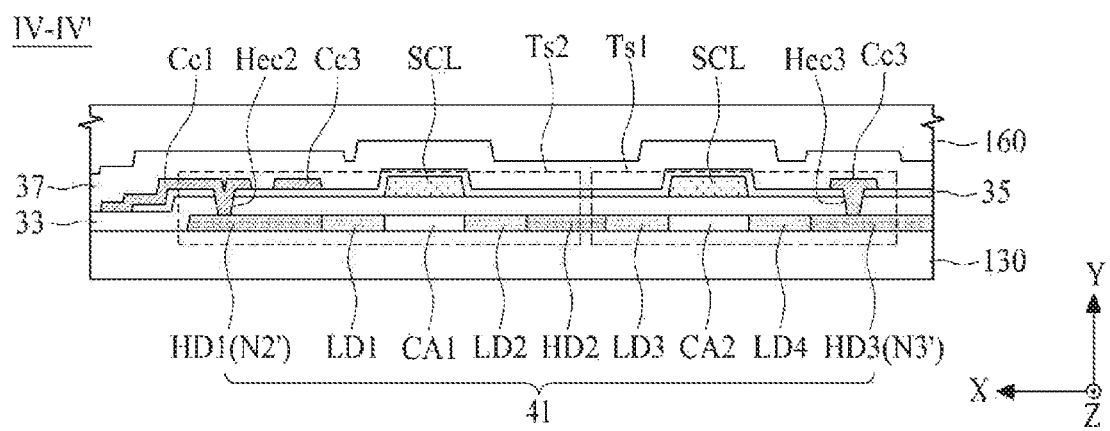
FIG. 10 is a cross-sectional view along line IV-IV' shown in FIG. 8.
Figure 11:
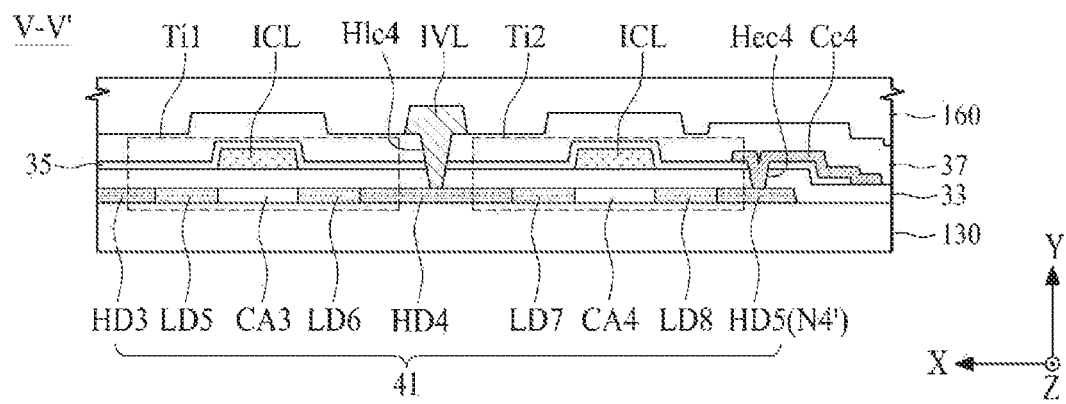
FIG. 11 is a cross-sectional view along line V-V' shown in FIG. 8.

FIG. 8 illustrates a layout of a second circuit layer shown in FIG. 4. FIG. 9 is a cross-sectional view along line shown in FIG. 8. FIG. 10 is a cross-sectional view along line IV-IV' shown in FIG. 8. FIG. 11 is a cross-sectional view along line V-V shown in FIG. 8. The second circuit layer 150 of the pixel may include a second semiconductor layer 31, a third semiconductor layer 41, a second gate insulating layer 33, an initialization control line ICL, a scan control line SCL, a second inter-layer dielectric layer 35, first to fourth electrode contact holes Hec1, Hec2, Hec3, and Hec4, first to fourth node contact holes Hnc1, Hnc2, Hnc3, and Hnc4, first to fourth circuit connectors Cc1 to Cc4, a second protective layer 37, a third line contact hole H1c3, a fourth line contact hole H1c4, a data line DL, and an initialization voltage line IVL.

The second circuit layer 150 may include a data supply transistor area, a sampling transistor area, and first and second initialization transistor areas, which are defined on the circuit insulating layer 130. The second semiconductor layer 31 is on the data supply transistor area defined on the circuit insulating layer 130. The second semiconductor layer 31 may include a polysilicon material. For example, the second semiconductor layer 31 may be on the data supply transistor area of the second circuit layer 130 to have a two-dimensional "]" shape. The second semiconductor layer 31 may include a channel area CA, first and second lightly doped areas LD1 and LD2 formed in parallel with each other by interposing the channel area CA, a first heavily doped area HD1 adjacent to the first lightly doped area LD1, and a second heavily doped area HD2 adjacent to the second lightly doped area LD2. The third semiconductor layer 41 may be on the circuit insulating layer 130 to pass through the sampling transistor area, and the first and second initialization transistor areas. The third semiconductor layer 41 may include a polysilicon material. For example, the third semiconductor layer 41 may be on the circuit insulating layer 130, and may have a two-dimensional "C" shape.

The third semiconductor layer 41 may include first to fourth channel areas CA1, CA2, CA3 and CA4, first and second lightly doped areas LD1 and LD2 formed in parallel with each other by interposing the first channel area CA1, third and fourth lightly doped areas LD3 and LD4 formed in parallel with each other by interposing the second channel area CA2, fifth and sixth lightly doped areas LD5 and LD6 formed in parallel with each other by interposing the third channel area CA3, seventh and eighth lightly doped areas LD7 and LD8 formed in parallel with each other by interposing the fourth channel area CA4. The third semiconductor layer 41 may further include a first heavily doped area HD1 adjacent to the first lightly doped area LD1, a second heavily doped area HD2 formed between the second lightly doped area LD2 and the third lightly doped area LD3, a third heavily doped area HD3 formed between the fourth lightly doped area LD4 and the fifth lightly doped area LD5, a fourth heavily doped area HD4 formed between the sixth lightly doped area LD6 and the seventh lightly doped area LD7, and a fifth heavily doped area HD5 adjacent to the eighth lightly doped area LD8.

The channel area CA of the second semiconductor layer 31 and each of the first and second channel areas CA1 and CA2 of the third semiconductor layer 41 may be formed in parallel with each other while having a two-dimensional "|" shape. The third and fourth channel areas CA3 and CA4 of the third semiconductor layer 41 are formed in parallel with each other while having a two-dimensional "|" shape. Each of the first and second heavily doped areas HD1 and HD2 of the second semiconductor layer 31 and each of the first to fifth heavily doped areas HD1 to HD5 of the third semiconductor layer 41 may be defined as areas having an impurity doping concentration higher than that of each of the first to eighth lightly doped areas LD1 to LD8. The first heavily doped region HD1 of the second semiconductor layer 31 may be used as the first source-drain electrodes of the data supply transistor Tds. The second heavily doped region HD2 of the second semiconductor layer 31 may be used as the second source-drain electrodes of the data supply transistor Tds, and may be defined as the first' node N1' of the second pixel circuit PC2.

The first heavily doped region HD1 of the third semiconductor layer 41 may be used as the second source-drain electrodes of the second sampling transistor Ts2, and may be defined as the second' node N2' of the second pixel circuit PC2. The third heavily doped region HD3 of the third semiconductor layer 41 may be used as the first source-drain electrodes of the first sampling transistor Ts1, and may be defined as the third' node N3' of the second pixel circuit PC2. The fifth heavily doped region HD5 of the third semiconductor layer 41 may be used as the second source-drain electrodes of the second initialization transistor Ti2, and may be defined by the fourth' node N4' of the second pixel circuit PC2. The second gate insulating layer 33 may be formed on the entire circuit insulating layer 130 to cover the second and third semiconductor layers 31 and 41. The second gate insulating layer 33 according to one example embodiment may be formed of a silicon oxide (SiOx), a silicon nitride (SiNx), or a multi-layered layer of SiOx and SiNx.

The initialization control line ICL may be on the second gate insulating layer 33 to overlap each of the third and fourth channel areas CA3 and CA4 of the third semiconductor layer 41 and extended longitudinally along the first direction X. The first area of the initialization control line ICL overlapped with the fourth channel area CA4 of the third semiconductor layer 41 may serve as the gate electrode of the second initialization transistor Ti2. The second area of the initialization control line ICL overlapped with the third channel area CA3 of the third semiconductor layer 41 may serve as the gate electrode of the first initialization transistor Ti1. Therefore, it is not required to form a separate gate electrode protruded from the initialization control line ICL to form the gate electrodes of the initialization transistors Ti1 and Ti2 in the pixel P. For this reason, a space in the pixel P for forming the gate electrode of the initialization transistors Ti1 and Ti2 may be saved.

The first area of the initialization control line ICL, the fourth channel area CA4 of the third semiconductor layer 41, the seventh lightly doped area LD7, the eighth lightly doped area LD8, the fourth heavily doped area HD4, and the fifth heavily doped area HD5 constitute the second initialization transistor Ti2. The second area of the initialization control line ICL, the third channel area CA3 of the third semiconductor layer 41, the fifth lightly doped area LD5, the sixth lightly doped area LD6, the third heavily doped area HD3, and the fourth heavily doped area HD4 constitute the first initialization transistor Ti1.

The scan control line SCL may be on the second gate insulating layer 33 to overlap each of the first and second channel areas CA1 and CA2 of the third semiconductor layer 41 and extended longitudinally along the first direction X in parallel with the initialization control line ICL. The first area of the scan control line SCL overlapped with the first channel area CA4 of the third semiconductor layer 41 may serve as the gate electrode of the second sampling transistor Ts2. The second area of the scan control line SCL overlapped with the second channel area CA2 of the third semiconductor layer 41 may serve as the gate electrode of the first sampling transistor Ts1. Therefore, it may not be required to form a separate gate electrode protruded from the scan control line SCL to form the gate electrodes of the sampling transistors Ts1 and Ts2 in the pixel P. For this reason, a space in the pixel P for forming the gate electrode of the sampling transistors Ts1 and Ts2 may be saved.

The first area of the scan control line SCL, the first channel area CA1 of the third semiconductor layer 41, the first lightly doped area LD1, the second lightly doped area LD2, the first heavily doped area HD1, and the second heavily doped area HD2 constitute the second sampling transistor Ts2. The second area of the scan control line SCL, the second channel area CA2 of the third semiconductor layer 41, the third lightly doped area LD3, the fourth lightly doped area LD4, the second heavily doped area HD2, and the third heavily doped area HD3 constitute the first sampling transistor Ts1. Therefore, the first and second sampling transistors Ts1 and Ts2 are connected with each other in series to have a dual channel structure. The initialization control line ICL and the scan control line SCL may be formed of a single layer or multi-layer comprised of any one of Mo, Al, Cr, Au, Ti, Ni, Nd and Cu or their alloy.

The second inter-layer dielectric layer 35 may be formed on the entire substrate to cover the initialization control line ICL and the scan control line SCL. The second inter-layer dielectric layer 35 according to one example embodiment may be formed of a silicon oxide (SiOx), a silicon nitride (SiNx), or a multi-layered layer of SiOx and SiNx. The first electrode contact hole Hec1 exposes the second source-drain electrodes of the data supply transistor Tds, that is, the second heavily doped area HD2 of the second semiconductor layer 31. The first electrode contact hole Hec1 according to one example embodiment may be formed to pass through the second gate insulating layer 33 and the second inter-layer dielectric layer 35, which are on the second heavily doped area HD2 of the second semiconductor layer 31, thereby partially exposing the second heavily doped area HD2 of the second semiconductor layer 31. Therefore, the first' node N1' of the second pixel circuit PC2 is exposed through the first electrode contact hole Hec1.

The second electrode contact hole Hec2 exposes the second source-drain electrodes of the second sampling transistor Ts2, that is, the first heavily doped area HD1 of the third semiconductor layer 41. The second electrode contact hole Hec2 according to one example embodiment may pass through the second gate insulating layer 33 and the second inter-layer dielectric layer 35, which are on the first heavily doped area HD1 of the third semiconductor layer 41, thereby partially exposing the first heavily doped area HD1 of the third semiconductor layer 41. Therefore, the second' node N2' of the second pixel circuit PC2 is exposed through the second electrode contact hole Hec2.

The third electrode contact hole Hec3 exposes the second source-drain electrodes of the first sampling transistor Ts1, that is, the third heavily doped area HD3 of the third semiconductor layer 41. The third electrode contact hole Hec3 according to one example embodiment may pass through the second gate insulating layer 33 and the second inter-layer dielectric layer 35, which are on the third heavily doped area HD3 of the third semiconductor layer 41, thereby partially exposing the third heavily doped area HD3 of the third semiconductor layer 41. Therefore, the third' node N3' of the second pixel circuit PC2 is exposed through the third electrode contact hole Hec3.

The fourth electrode contact hole Hec4 exposes the second source-drain electrodes of the second initialization transistor Ti2, that is, the fifth heavily doped area HD5 of the third semiconductor layer 41. The fourth electrode contact hole Hec4 according to one example embodiment may pass through the second gate insulating layer 33 and the second inter-layer dielectric layer 35, which are on the fifth heavily doped area HD5 of the third semiconductor layer 41, thereby partially exposing the fifth heavily doped area HD5 of the third semiconductor layer 41. Therefore, the fourth' node N4' of the second pixel circuit PC2 is exposed through the fourth electrode contact hole Hec4.

Figure 12:
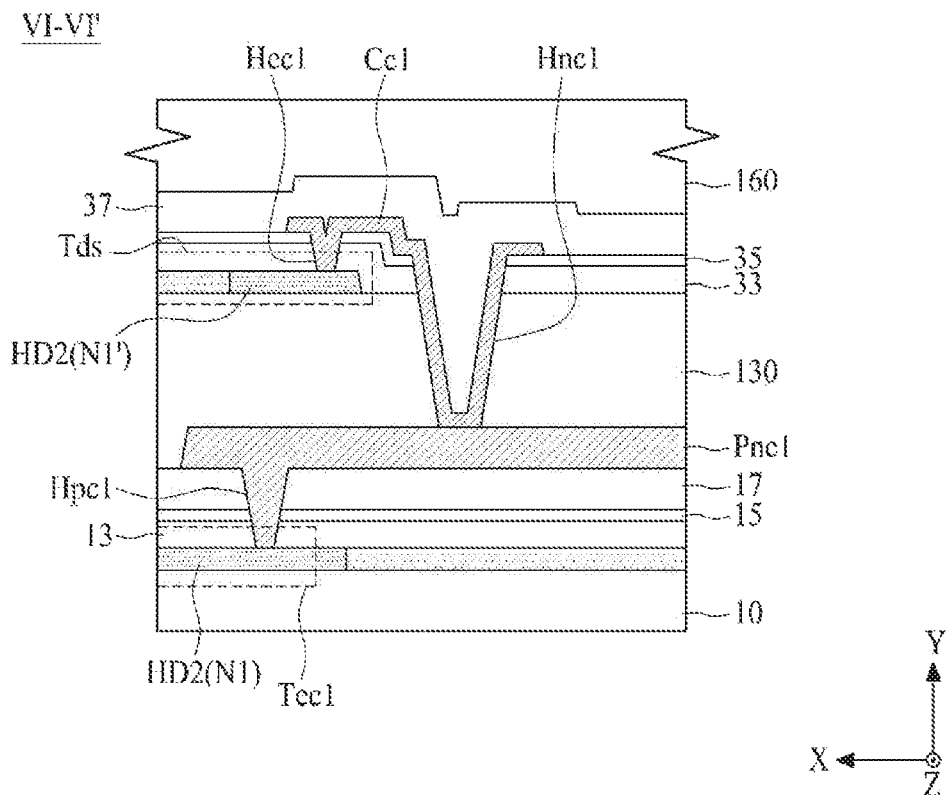
FIG. 12 is a cross-sectional view along line VI-VI' shown in FIG. 8.

The first node contact hole Hnc1, as shown in FIG. 12, partially exposes the first node connection pattern Pnc1 on the first circuit layer 110. The first node contact hole Hnc1 according to one example embodiment may pass through the second inter-layer dielectric layer 35, the second gate insulating layer 33 and the circuit insulating layer 130, which are on the first node connection pattern Pnc1, thereby partially exposing the first node connection pattern Pnc1. Therefore, the first node connection pattern Pnc1 connected to the first node N1 of the first pixel circuit PC1 is exposed through the first node contact hole Hnc1.

Figure 13:
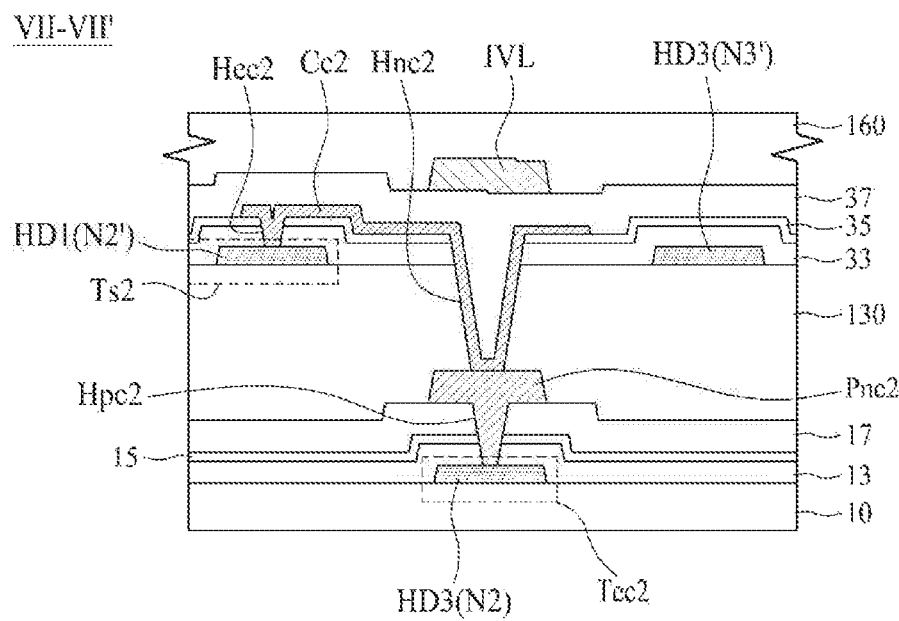
FIG. 13 is a cross-sectional view along line VII-VII' shown in FIG. 8.

The second node contact hole Hnc2, as shown in FIG. 13, partially exposes the second node connection pattern Pnc2 on the first circuit layer 110. The second node contact hole Hnc2 according to one example embodiment may pass through the second inter-layer dielectric layer 35, the second gate insulating layer 33 and the circuit insulating layer 130, which are on the second node connection pattern Pnc2, thereby partially exposing the second node connection pattern Pnc2. Therefore, the second node connection pattern Pnc2 connected to the second node N2 of the first pixel circuit PC1 is exposed through the second node contact hole Hnc2.

Figure 14:
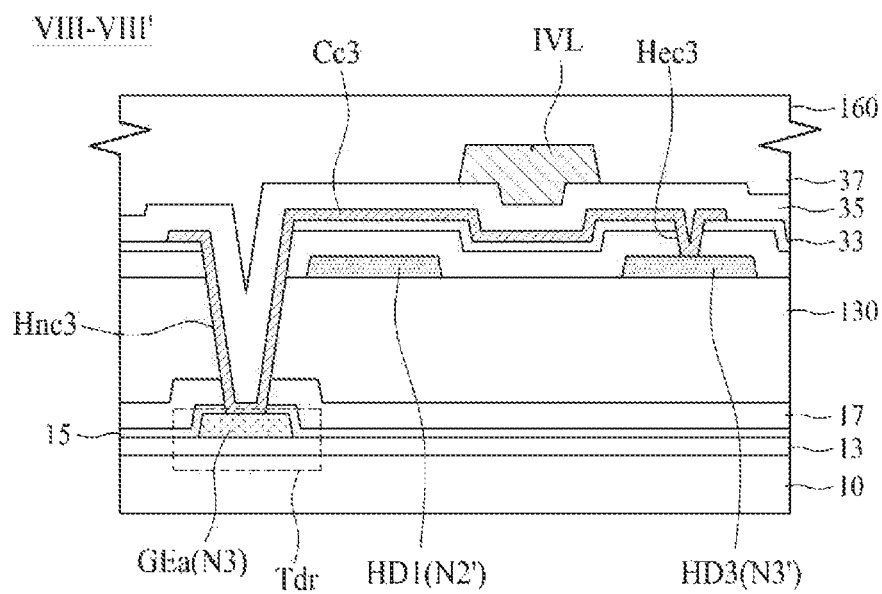
FIG. 14 is a cross-sectional view along line VIII-VIII' shown in FIG. 8.

The third node contact hole Hnc3, as shown in FIG. 14, partially exposes the protrusion electrode GEa (or the third node connection pattern) protruded from the gate electrode of the driving transistor Tdr on the first circuit layer 110. The first node contact hole Hnc1 may pass through the second inter-layer dielectric layer 35, the second gate insulating layer 33, the circuit insulating layer 130, the first protective layer 17 and the first inter-layer dielectric layer 15. These layers may be on the third node connection pattern Pnc3, thereby partially exposing the third node connection pattern Pnc3. Therefore, the third node connection pattern Pnc3 connected to the third node N3 of the first pixel circuit PC1 is exposed through the third node contact hole Hnc3.

Figure 15:
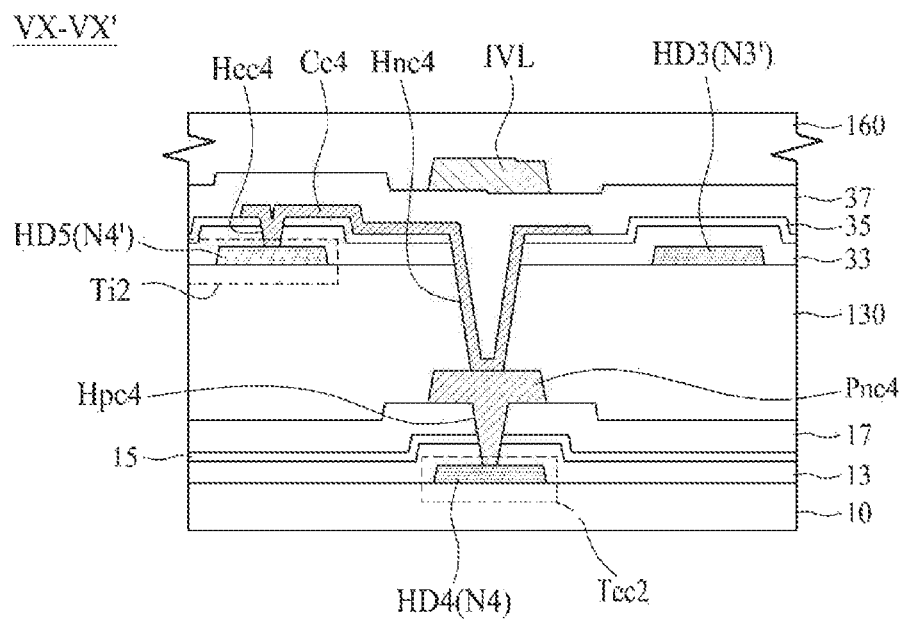
FIG. 15 is a cross-sectional view along line VX-VX' shown in FIG. 8.

The fourth node contact hole Hnc4, as shown in FIG. 15, partially exposes the fourth node connection pattern Pnc4 on the first circuit layer 110. The fourth node contact hole Hnc4 according to one example embodiment may pass through the second inter-layer dielectric layer 35, the second gate insulating layer 33 and the circuit insulating layer 130, which are on the fourth node connection pattern Pnc4, thereby partially exposing the fourth node connection pattern Pnc4. Therefore, the fourth node connection pattern Pnc4 connected to the fourth node N4 of the first pixel circuit PC1 is exposed through the fourth node contact hole Hnc4.

As illustrated in FIGS. 4, 8 and 12, the first circuit connector Cc1 electrically connects the first node N1 formed on the first circuit layer 110 with the first' node N1' formed on the second circuit layer 150. The first circuit connector Cc1 according to one example embodiment may be formed in an island shape on the second inter-layer dielectric layer 35 to overlap each of the first electrode contact hole Hec1 and the first node contact hole Hnc1, and thus electrically connecting the first node N1 of the first circuit layer 110 with the first' node N1' of the second circuit layer 150. One side of the first circuit connector Cc1 may be electrically connected with the first' node N1' of the second circuit layer 150 through the first electrode contact hole Hec1 and thus electrically connected with the second source-drain electrodes of the data supply transistor Tds through the first' node N1' of the second circuit layer 150. The other side of the first circuit connector Cc1 may be electrically connected with the first node connection pattern Pnc1 of the first circuit layer 110 through the first node contact hole Hnc1, and thus electrically connected with the first node N1 of the first circuit layer 110 through the first node connection pattern Pnc1.

As illustrated in FIGS. 4, 8 and 13, the second circuit connector Cc2 electrically connects the second node N2 formed on the first circuit layer 110 with the second' node N2' formed on the second circuit layer 150. The second circuit connector Cc2 according to one example embodiment may be formed in an island shape on the second inter-layer dielectric layer 35 to overlap each of the second electrode contact hole Hec2 and the second node contact hole Hnc2, and thus electrically connect the second node N2 of the first circuit layer 110 with the second' node N2' of the second circuit layer 150. One side of the second circuit connector Cc2 may be electrically connected with the second' node N2' of the second circuit layer 150 through the second electrode contact hole Hec2, and thus electrically connect the second source-drain electrodes of the second sampling transistor Ts2 through the second' node N2' of the second circuit layer 150. The other side of the second circuit connector Cc2 may be electrically connected with the second node connection pattern Pnc2 of the first circuit layer 110 through the second node contact hole Hnc2 and thus electrically connected with the second node N2 of the first circuit layer 110 through the second node connection pattern Pnc2.

As illustrated in FIGS. 4, 8 and 14, the third circuit connector Cc3 electrically connects the third node N3 formed on the first circuit layer 110 with the third' node N3' formed on the second circuit layer 150. The third circuit connector Cc3 according to one example embodiment may be formed in an island shape on the second inter-layer dielectric layer 35 to overlap each of the third electrode contact hole Hec3 and the third node contact hole Hnc3 and thus electrically connect the third node N3 of the first circuit layer 110 with the third' node N3' of the second circuit layer 150. One side of the third circuit connector Cc3 may be electrically connected with the third' node N3' of the second circuit layer 150 through the third electrode contact hole Hec3 and thus electrically connected with the second source-drain electrodes of the first sampling transistor Ts1 through the third' node N3' of the second circuit layer 150. The other side of the third circuit connector Cc3 may be electrically connected with the third node connection pattern Pnc3 of the first circuit layer 110 through the third node contact hole Hnc3 and thus electrically connected with the third node N3 of the first circuit layer 110. That is, the other side of the third circuit connector Cc3 may be electrically connected with the gate electrode of the driving transistor Tdr through the third node connection pattern Pnc3.

As illustrated in FIGS. 4, 8 and 15, the fourth circuit connector Cc4 electrically connects the fourth node N4 formed on the first circuit layer 110 with the fourth' node N4' formed on the second circuit layer 150. The fourth circuit connector Cc4 according to one example embodiment may be formed in an island shape on the second inter-layer dielectric layer 35 to overlap each of the fourth electrode contact hole Hec4 and the fourth node contact hole Hnc4 and thus electrically connect the fourth node N4 of the first circuit layer 110 with the fourth' node N4' of the second circuit layer 150. One side of the fourth circuit connector Cc4 may be electrically connected with the fourth' node N4' of the second circuit layer 150 through the fourth electrode contact hole Hec4 and thus electrically connected with the second source-drain electrodes of the second initialization transistor Ti2 through the fourth' node N4' of the second circuit layer 150. The other side of the fourth circuit connector Cc4 may be electrically connected with the fourth node connection pattern Pnc4 of the first circuit layer 110 through the fourth node contact hole Hnc4, and thus electrically connected with the fourth node N4 of the first circuit layer 110 through the fourth node connection pattern Pnc4.

The first to fourth circuit connectors Cc1, Cc2, Cc3 and Cc4 according to one example embodiment may be formed of a single layer or multi-layer comprised of any one of Mo, Al, Cr, Au, Ti, Ni, Nd and Cu or their alloy. The first to fourth circuit connectors Cc1, Cc2, Cc3 and Cc4 may compactly be between the initialization control line ICL and the scan control line SCL in the pixel P in parallel to minimize interference with the transistors. Particularly, the first to fourth circuit connectors Cc1, Cc2, Cc3 and Cc4 may electrically connect the first circuit layer 110 with the second circuit layer 150 without increasing a size of the pixel P.

As illustrated in FIGS. 8 to 11 and FIG. 4 again, the second protective layer 37 may be formed on the circuit insulating layer 130 to cover the first to fourth circuit connectors Cc1, Cc2, Cc3 and Cc4 and the second inter-layer dielectric layer 35. The second protective layer 37 may be formed of a silicon oxide (SiOx), a silicon nitride (SiNx), or a multi-layered layer of SiOx and SiNx. The third line contact hole H1c3 exposes the first source-drain electrodes of the data supply transistor Tds, that is, a portion of the first heavily doped area HD1 of the second semiconductor layer 31. The third line contact hole H1c3 according to one example embodiment may pass through the second gate insulating layer 33, the second inter-layer dielectric layer 35 and the second protective layer 37. These layers may be on the first heavily doped area HD1 of the second semiconductor layer 31, thereby partially exposing the first heavily doped area HD1 of the second semiconductor layer 31.

The fourth line contact hole H1c4 exposes the first source-drain electrodes of the first initialization control transistor Ti1, that is, a portion of the fourth heavily doped area HD4 of the third semiconductor layer 41. The fourth line contact hole H1c4 according to one example embodiment may be formed to pass through the second gate insulating layer 33, the second inter-layer dielectric layer 35 and the second protective layer 37. These layers may be on the fourth heavily doped area HD4 of the third semiconductor layer 41, thereby partially exposing the fourth heavily doped area HD4 of the third semiconductor layer 41. The data line DL may be formed on the second protective layer 37 along the second direction Y to pass through the third line contact hole H1c3. The data line DL may be electrically connected with the first heavily doped area HD1 of the second semiconductor layer 31 through the third line contact hole H1c3, and thus electrically connected with the first source-drain electrodes of the data supply transistor Tds.

The initialization voltage line IVL may be formed on the second protective layer 37 along the second direction Y to pass through the fourth line contact hole H1c3 while being parallel with the data line DL. The initialization voltage line IVL may be between the third and fourth channel areas CA3 and CA4 of the third semiconductor layer 41, which are formed in parallel with each other. The initialization voltage line IVL may be electrically connected with the fourth heavily doped area HD4 of the third semiconductor layer 41 through the fourth line contact hole H1c4 and thus supplies an initialization voltage to the first source-drain electrodes of the first and second initialization transistors Ti1 and Ti2.

Each of the data line DL and the initialization voltage line IVL may be formed of a single layer made of any one of Mo, Al, Cr, Au, Ti, Ni, Nd, and CU and/or their alloy(s). Alternatively, the single layer may be formed of a multi-layered structure such as a deposition structure (Ti/Al/Ti) of Al and Ti, a deposition structure (ITO/Al/ITO) of Al and ITO, an APC (Ag/Pd/Cu) alloy, and/or a deposition structure (ITO/APC/ITO) of APC alloy and ITO. In one example embodiment, because the pixel circuit of the pixel P is divided into the first circuit layer 110 and the second circuit layer 130 such that the first circuit layer 110 and the second circuit layer 130 are deposited on the pixel area, the pixel circuit may be sufficiently arranged in the pixel P even though the size of the pixel P may be reduced due to high resolution. In this example embodiment, the light emitting display apparatus having high resolution may be implemented. All or some of the transistors may be modified into N types within the range that does not depart from the technical features of the present disclosure that implements the pixel of ultra-high resolution by depositing two or more circuit layers, without limitation to the P types. The light emitting display apparatus may be applied to portable electronic devices such as a smart phone that needs high resolution, a mobile communication terminal, a mobile phone, a tablet PC (personal computer), a smart watch, a watch phone, a wearable device, a television, a notebook computer, a monitor, a refrigerator, a virtual image display apparatus, or a head mounted display apparatus.

It will be apparent to those skilled in the art that various modifications and variations may be made in a display device of the present disclosure without departing from the sprit or scope of the example embodiments. Thus, it is intended that the present disclosure covers the modifications and variations of this disclosure provided they come within the scope of the appended claims and their equivalents.

What is claimed is:

1. A light emitting display apparatus, comprising:
   a substrate; and
   a plurality of pixels disposed on a pixel area on the substrate, wherein each of the plurality of pixels includes:
      a first circuit layer including a first pixel circuit including a driving transistor;
      a second circuit layer overlapping the first circuit layer, wherein the second circuit layer includes a second pixel circuit including a data supply transistor configured to supply a data signal to the first pixel circuit;
      a circuit insulating layer between the first circuit layer and the second circuit layer; and
      a light emitting diode layer including a light emitting diode electrically connected with the first pixel circuit,
   wherein the first pixel circuit is configured to supply a data current corresponding to a gate-source voltage of the driving transistor to the light emitting diode based on the data signal supplied from the second pixel circuit.

2. The light emitting display apparatus of claim 1, wherein the first circuit layer is between the substrate and the circuit insulating layer.

3. The light emitting display apparatus of claim 1, wherein the second circuit layer further includes a plurality of circuit connectors configured to electrically connect the second pixel circuit with the first pixel circuit through the circuit insulating layer.

4. The light emitting display apparatus of claim 1, wherein the driving transistor includes first source-drain electrodes connected to a first node, second source-drain electrodes connected to a second node, and a gate electrode connected to a third node.

5. The light emitting display apparatus of claim 4, wherein the first pixel circuit includes:
   a first light emitting control transistor configured to turn on based on a light emitting control signal, wherein the light emitting control signal is configured to supply a pixel driving voltage to the first node;
   a second light emitting control transistor configured to turn on based on the light emitting control signal, thereby forming a current path between the second node and a fourth node; and
   a storage capacitor including a first capacitor electrode corresponding to a gate electrode of the driving transistor, and a second capacitor electrode that overlaps the first capacitor electrode, wherein the second capacitor electrode is configured to be supplied with the pixel driving voltage,
   wherein the light emitting diode is electrically connected with the fourth node.

6. The light emitting display apparatus of claim 5, wherein the first circuit layer includes:
   a light emitting control line configured to supply the light emitting control signal to the first pixel circuit;
   a pixel driving power line configured to supply the pixel driving voltage to the first pixel circuit;
   a first line contact hole electrically connecting the pixel power driving line with first source-drain electrodes of the first light emitting control transistor; and
   a second line contact hole electrically connecting the pixel power driving line with the second capacitor electrode.

7. The light emitting display apparatus of claim 5, wherein the second pixel circuit further includes:
   the data supply transistor configured to turn on based on a scan control signal, thereby supplying the data signal to the first node;
   a sampling transistor configured to turn on based on the scan control signal, thereby electrically connecting the second node with the third node;
   a first initialization transistor configured to turn on based on an initialization control signal, thereby supplying an initialization voltage to the third node; and
   a second initialization transistor configured to turn on based on the initialization control signal, thereby supplying the initialization voltage to the fourth node.

8. The light emitting display apparatus of claim 7, wherein the sampling transistor includes first and second sampling transistors connected in series between the second node and the third node.

9. The light emitting display apparatus of claim 7, wherein the second circuit layer further includes:
   a data line configured to supply the data signal to the second pixel circuit;
   a scan control line configured to supply the scan control signal to the second pixel circuit;
   an initialization control line configured to supply the initialization control signal to the second pixel circuit;
   an initialization voltage line configured to supply the initialization voltage to the second pixel circuit;
   a third line contact hole electrically connecting the data line with first source-drain electrodes of the data supply transistor; and
   a fourth line contact hole electrically connecting the initialization voltage line with first source-drain electrodes of each of the first initialization transistor and the second initialization transistor.

10. The light emitting display apparatus of claim 5, wherein the first circuit layer further includes:
- a first node connection pattern electrically connected with the first node;
- a second node connection pattern electrically connected with the second node;
- a third node connection pattern electrically connected with the gate electrode of the driving transistor; and
- a fourth node connection pattern electrically connected with the fourth node,
- wherein each of the first to fourth node connection patterns is electrically connected with the second pixel circuit.

11. The light emitting display apparatus of claim 10, wherein the second circuit layer further includes:
- first, second, third, and fourth circuit connectors respectively electrically connected with each of the first to fourth node connection patterns;
- the data supply transistor configured to turn on based on a scan control signal supplied to a scan control line, thereby supplying the data signal supplied from a data line to the first circuit connector;
- a sampling transistor configured to turn on based on the scan control signal, thereby electrically connecting the second circuit connector with the third circuit connector;
- a first initialization transistor configured to turn on based on an initialization control signal supplied to an initialization control line, thereby supplying an initialization voltage supplied from an initialization voltage line to the third circuit connector; and
- a second initialization transistor configured to turn on based on the initialization control signal, thereby supplying the initialization voltage to the fourth circuit connector.

12. The light emitting display apparatus of claim 11, wherein the initialization control line and the scan control line are parallel to each other, and the first to fourth circuit connectors are between the initialization control line and the scan control line.

13. The light emitting display apparatus of claim 1, further comprising:
- a planarization layer covering the second circuit layer; and
- an encapsulation layer covering the light emitting diode layer,
- wherein the light emitting diode includes:
  - a pixel driving electrode electrically connected with the first pixel circuit;
  - a light emitting layer on the pixel driving electrode; and
  - a cathode electrode layer electrically connected with the light emitting layer.

14. The light emitting display apparatus of claim 1, wherein
the first circuit layer is on the substrate,
the circuit insulating layer is on the first circuit layer,
the second circuit layer is on the circuit insulating layer, and
the light emitting diode layer is on the second circuit layer.

* * * * *